(12) United States Patent
Li

(10) Patent No.: US 9,641,085 B2
(45) Date of Patent: May 2, 2017

(54) SWITCHING POWER CONVERTER, CLOCK MODULE, CONTROL CIRCUIT AND ASSOCIATED CONTROL METHOD

(71) Applicant: Chengdu Monolithic Power Systems Co., Ltd., Chengdu (CN)

(72) Inventor: Yike Li, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 117 days.

(21) Appl. No.: 14/630,215

(22) Filed: Feb. 24, 2015

(65) Prior Publication Data

US 2015/0244276 A1  Aug. 27, 2015

(30) Foreign Application Priority Data

Feb. 25, 2014 (CN) .......................... 2014 1 0064983

(51) Int. Cl.
*H02M 3/335* (2006.01)
*H03K 21/08* (2006.01)
*H03K 23/66* (2006.01)
*H02M 1/36* (2007.01)

(52) U.S. Cl.
CPC .......... *H02M 3/33507* (2013.01); *H02M 1/36* (2013.01); *H03K 21/08* (2013.01); *H03K 23/667* (2013.01)

(58) Field of Classification Search
CPC .......... H02M 1/32; H02M 1/36; H02M 3/335; H02M 3/33507; H03K 21/00; H03K 21/08; H03K 23/667
See application file for complete search history.

(56) References Cited

U.S. PATENT DOCUMENTS

| 7,649,755 B2 * | 1/2010 | Kogel ............... H02M 3/33507 363/21.11 |
| 8,508,958 B2 * | 8/2013 | Orr ...................... H02M 3/3376 363/21.02 |
| 2007/0096781 A1 * | 5/2007 | Ito ......................... H02M 3/157 327/112 |
| 2012/0049829 A1 * | 3/2012 | Murakami .............. H02M 1/32 323/288 |

* cited by examiner

*Primary Examiner* — Matthew Nguyen
(74) *Attorney, Agent, or Firm* — Perkins Coie LLP

(57) ABSTRACT

A power converter having a clock module and a method for controlling a clock signal of the power converter. The clock module is configured to provide the clock signal and to set a clock frequency of the clock signal to a first predetermined frequency at the moment when the power converter is powered on. The clock module is further configured to regulate the clock frequency to increase from the first predetermined frequency to a second predetermined frequency through a predetermined times of step type frequency increase during a startup procedure of the power converter.

20 Claims, 6 Drawing Sheets

SWITCHING POWER CONVERTER, CLOCK MODULE, CONTROL CIRCUIT AND ASSOCIATED CONTROL METHOD

CROSS-REFERENCE TO RELATED APPLICATION(S)

This application claims priority to and the benefit of China Patent Application No. 201410064983.5, filed Feb. 25, 2014, which is incorporated herein by reference in its entirety.

TECHNICAL FIELD

This disclosure relates generally to power converters, and more particularly but not exclusively relates to switching power converters, clock module and control circuit.

BACKGROUND

Switching power converters are widely used in various electronic devices. A switching power converter typically comprises at least one switch and is configured to convert an input voltage to a desired output voltage through controlling the on and off switching of the at least one switch.

One of the most frequently used control methods of switching power converters includes peak current control pulse width modulation method. In brief, a switching power converter which operates with the peak current control pulse width modulation method regulates a main switch of the switching power converter to switch on and off with a substantially constant frequency determined by a system clock signal, and regulates the on time of the main switch in each switching cycle based on a feedback signal indicative of the output voltage and a current sense signal indicative of a switching current flowing through the main switch. A fraction of the on time of the main switch during the total time of an on and off switching cycle may be referred to as an on duty cycle of the switching power converter.

The switching power converter may also needs to limit its output current or the switching current to keep the output current lower than an output current limit threshold (or the switching current lower than a switching current threshold) so that the switching power converter and loads supplied by the switching converter can operate in a safe operation current range. Generally, the limitation of the output current and/or the switching current can be realized through controlling a peak value of the switching current to be lower than a predetermined peak current threshold. However, since there exists a parasitic capacitor between the main switch and a reference ground of the switching power converter, it is necessary to blank a leading edge of the current sense signal indicative of the switching current so that the current sense signal is disabled during a predetermined leading edge blanking (LEB) time, in order to prevent a current limit function from being mis-triggered due to spikes occurred at each leading edge of the current sense signal. Therefore, a minimum duty cycle of the switching converter is required.

For example, for a buck switching power converter, given a period of the system clock signal is 16 µs (i.e. the on and off switching cycle of the main switch is 16 µs) and a 250 ns LEB time is required, it can be deduced that the minimum duty cycle of the buck switching power converter should be $250/16000 \approx 1.5\%$. Assuming a maximum allowable input voltage of the buck switching power converter is 380V and a 12V output voltage is desired, the on duty cycle should be $12/380$, approximately 3%, which is larger than the required 1.5% minimum duty cycle. Thus, the buck switching converter can operate normally in this circumstance. However, at a startup of the buck switching power converter, the instantaneous output voltage is quite small compared with the desired value of the output voltage, therefore the duty cycle theoretically should be smaller than the 1.5% minimum duty cycle. However, the buck switching converter practically operates with the 1.5% minimum duty cycle, resulting in over charge of an inductor of the buck switching converter in each switching cycle, which leads to the inductor current continuously increasing. As a result, the inductor current may exceed a maximum allowable safe operating current in a very short time, causing the buck switching converter to fail to operate normally. In another aspect, the main switch of the buck switching converter (e.g. a metal oxide semiconductor transistor) generally has limited current conduction capability. The continuous increase in the inductor current also means a continuous increase of a switching current that should be flowing through the main switch. This can lead to quick saturation of the main switch and abrupt increase in a drain to source voltage of the main switch, resulting in a higher conduction loss. In this circumstance, the main switch not only has to suffer from high voltage and temperature pressure, but also has the risk of being damaged, which harms the stability and the robustness of the buck switching converter.

Typically used soft-start techniques, such as soft-starting a peak current threshold of the switching current or soft-starting the reference voltage indicative of the desired value of the output voltage can not resolve the above mentioned problems.

SUMMARY

In accomplishing the above and other objects, there has been provided, in accordance with an embodiment of the present disclosure, a clock module for providing a clock signal to a power converter. The power converter may have a startup procedure beginning at the moment when the power converter is powered on and ending when an output voltage of the power converter arrives at a desired steady state value. The clock module may comprise a clock generator and a clock frequency modulator. The clock generator may have a clock control terminal and a clock output terminal, wherein the clock control terminal is configured to receive a frequency regulation signal, and wherein the clock generator is configured to provide the clock signal at the clock output terminal, and wherein the clock signal has a sequence of clock pulses and a clock frequency. The clock frequency modulator may have a modulator input terminal and a modulator output terminal, wherein the modulator input terminal is configured to receive the clock signal, and wherein the clock frequency modulator is configured to perform a timing based on the pulses of the clock signal and to provide the frequency regulation signal at the modulator output terminal based on the timing, and wherein the frequency regulation signal is configured to set the clock frequency at a first predetermined frequency at the moment when the power converter is powered on, and to regulate the clock frequency to increase from the first predetermined frequency to a second predetermined frequency through a predetermined times of step type frequency increase during the startup procedure.

There has also been provided, in accordance with an embodiment of the present disclosure, a power converter. The power converter may have an input port configured to receive an input voltage, and an output port configured to provide an output voltage. The power converter may comprise a clock module, a switch module and a control circuit. The clock module is configured to provide a clock signal having a sequence of clock pulses and a clock frequency, and is further configured to set the clock frequency at a first predetermined frequency at the moment when the power converter is powered on, and to regulate the clock frequency to increase from the first predetermined frequency to a second predetermined frequency through a predetermined times of step type frequency increase during a startup procedure of the power converter. The switch module may at least comprise a main switch and be configured to conduct on and off switching in response to a pulse width modulation signal so as to convert the input voltage into the output voltage. The control circuit may be configured to receive a feedback signal indicative of the output voltage, a first current sense signal indicative of a switching current flowing through the main switch, a reference signal indicative of a desired value of the output voltage, and a first current limit threshold indicative of a maximum allowable peak value of the switching current. The control circuit is further configured to receive an off trigger signal based on the feedback signal, the first current sense signal, the reference signal and the first current limit threshold, and generate the pulse width modulated signal based on the clock signal and the off trigger signal, wherein the clock signal is configured to trigger the pulsed width modulated signal to turn the main switch on, and wherein the off trigger signal is configured to trigger the pulse width modulated signal to turn the main switch off.

There has also been provided, in accordance with an embodiment of the present disclosure, a control circuit for a power converter. The control circuit may comprise a clock module for providing a clock signal to the power converter, wherein the clock signal has a sequence of clock pulses and a clock frequency. The clock module is configured to set the clock frequency at a first predetermined frequency at the moment when the power converter is powered on, and to regulate the clock frequency to increase from the first predetermined frequency to a second predetermined frequency through a predetermined times of step type frequency increase during a startup procedure of the power converter. The control circuit may be configured to receive a feedback signal indicative of the output voltage, a first current sense signal indicative of a switching current flowing through the main switch, a reference signal indicative of a desired value of the output voltage, and a first current limit threshold indicative of a maximum allowable peak value of the switching current. The control circuit is further configured to an off trigger signal based on the feedback signal, the first current sense signal, the reference signal and the first current limit threshold, and generate a pulse width modulated signal based on the clock signal and the off trigger signal, wherein the clock signal is configured to trigger the pulsed width modulated signal to turn the main switch on, and wherein the off trigger signal is configured to trigger the pulse width modulated signal to turn the main switch off.

There has also been provided, in accordance with an embodiment of the present disclosure, a method for controlling a clock signal of a power converter. The power converter has a startup procedure beginning at the moment when the power converter is powered on and ending when an output voltage of the power converter arrives at a desired steady state value. The method comprising: generating a clock signal having a sequence of clock pulses and a clock frequency; and setting the clock frequency at a first predetermined frequency at the moment when the power converter is powered on and regulating the clock frequency to increase from the first predetermined frequency to a second predetermined frequency through a predetermined times of step type frequency increase.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

The use of the same reference label in different drawings indicates the same or like components or structures with substantially the same functions for the sake of simplicity.

DETAILED DESCRIPTION

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. Those skilled in the art should understand that the meanings of the terms identified above do not necessarily limit the terms, but merely provide illustrative examples for the terms.

Figure 1:
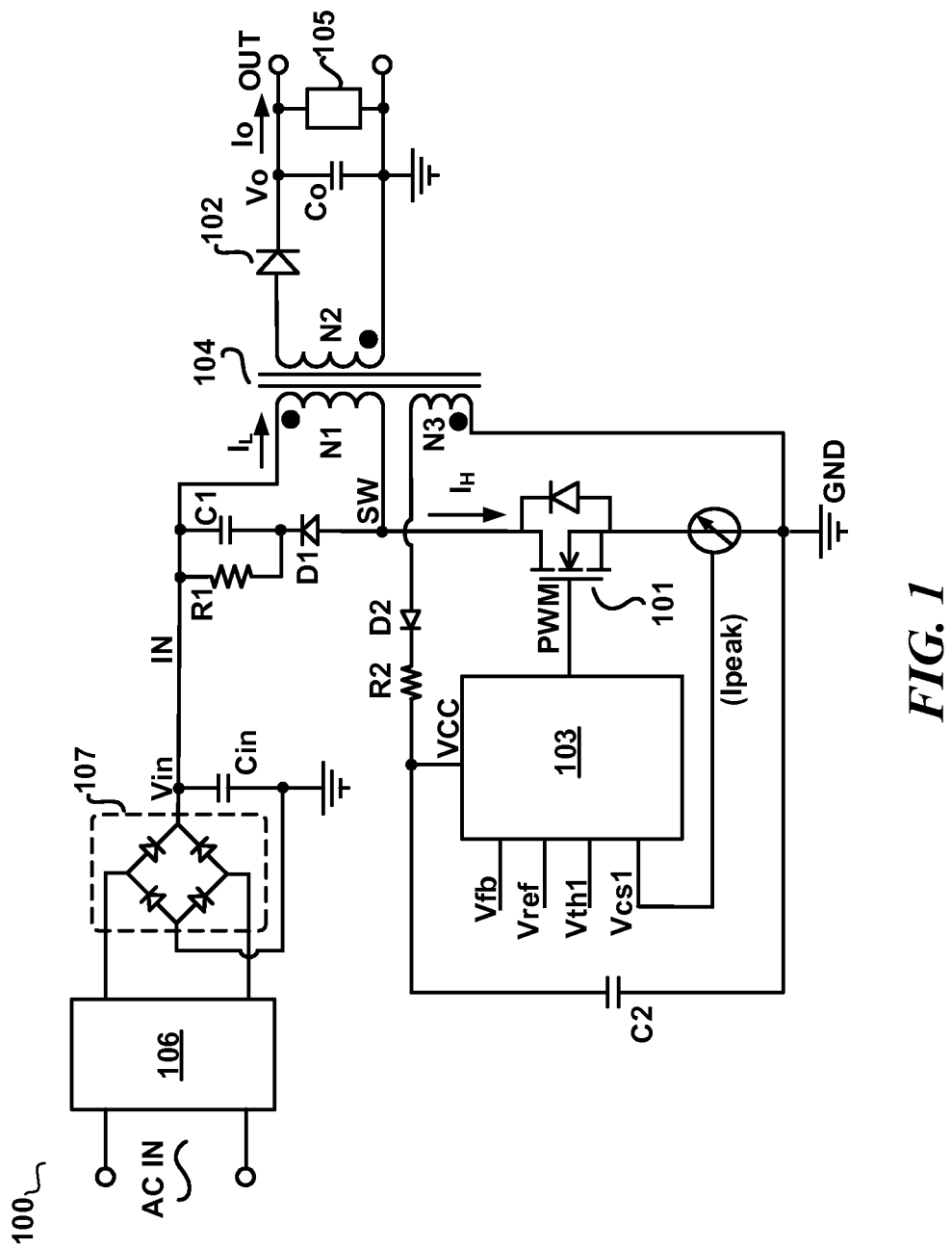
FIG. 1 illustrates a schematic diagram of a switching power converter 100 in accordance with an exemplary embodiment of the present invention.

FIG. 1 illustrates a schematic diagram of a switching power converter 100 in accordance with an exemplary embodiment of the present invention. The power converter 100 may comprise an input port IN configured to receive an input voltage Vin; an output port OUT configured to provide an output voltage Vo and an output current Io for supplying a load 105. The power converter 100 further comprises a switch module illustrated as to at least comprise a main switch, such as the main switch 101 illustrated in FIG. 1. The switch module is configured to conduct on and off switching in response to a pulse width modulated signal PWM so as to convert the input voltage Vin into the output voltage Vo. The power converter 100 further comprises a control circuit 103. The control circuit 103 may at least comprise a first control input terminal, a second control input terminal, a third control input terminal, a fourth control input terminal and a first control output terminal. The first control input terminal is configured to detect/receive a feedback signal Vfb indicative of the output voltage Vo. The second control input terminal is configured to detect/receive a first current sense signal Vcs1 indicative of the output current Io. The third control input terminal is configured to receive a reference signal Vref indicative of a desired value of the output voltage Vo. The fourth control input terminal is configured to receive a first current limit threshold Vth1 indicative of a maximum allowable value of the output current Io. The control circuit 103 is configured to generate the pulse width modulated signal PWM based on the feedback signal Vfb, the first current sense signal Vcs1, the reference signal Vref and the first current limit threshold Vth1.

In accordance with an exemplary embodiment of the present invention, the switching power converter 100 may further comprise a second switch 102. In the example of FIG. 1, the main switch 101 may comprise any controllable switching element such as MOSFET, JET, DMOS, IGBT etc. The second switch 102 is exemplarily illustrated to comprise a freewheeling diode. The second switch 102 is configured to switch on and off in complementary with the main switch 101, i.e. the second switch 102 is switched off when the main switch 101 is switched on and is switched on when the main switch 101 is switched off. In other embodiments, the second switch 102 may comprise a controllable switching element, such as MOSFET, JET, DMOS, IGBT etc. In such an embodiment, the pulse width modulated signal PWM is further configured to control the second switch 102 so that the second switch is switched on and off complementarily with the main switch 101.

In accordance with an exemplary embodiment of the present invention, the switching power converter 100 may further comprise an inductive energy storage device 104. The inductive energy storage device 104 is configured to be electrically coupled to the input port IN to store energy when the main switch 101 is switched on, and is configured to be electrically coupled to the output port OUT to discharge energy to the load 105 when the main switch 101 is switched off. In the example of FIG. 1, the inductive energy storage device 104 is illustrated to comprise a transformer having a primary winding N1 and a secondary winding N2, wherein the primary winding N1 is electrically coupled to the input port IN and the main switch 101, and the secondary winding N2 is electrically coupled to the output port OUT through the second switch 102. In accordance with an exemplary embodiment of the present invention, the switching power converter 100 may further comprise a capacitive output filtering device Co which is coupled between the output port OUT and the reference ground GND to filter the output signal of the switch module so that the output voltage Vo provided at the output port OUT is smoothed. The switching power converter 100 in the example of FIG. 1 is configured to have a flyback converter topology and is thus referred to as a flyback switching converter 100. The input voltage Vin provided to the input port IN of the flyback switching converter 100 is an unregulated DC voltage. In an embodiment, the unregulated input voltage Vin can be provided from an AC voltage source through an EMI filter 106, a rectification bridge 107 and an input capacitor Cin, as shown in FIG. 1. Flyback converters that can realize AC to DC voltage conversion, such as the flyback switching converter 100 illustrated in FIG. 1, have quite wide application market and can isolate the output voltage Vo from the AC voltage supply source. In accordance with an embodiment of the present invention, the inductive energy storage device 104 of the flyback switching power converter 100 may further comprise a third winding N3, functioning as an auxiliary winding, which is configured to provide a supply voltage Vcc to the control circuit 103 through a diode D2 and a resistor R2 connected in series. A capacitor C2 is coupled between the supply voltage Vcc and the reference ground GND to filter the supply voltage Vcc. It should be understood that the switching power converter 100 is not confined to have the flyback topology. In other embodiments, the power converter 100 may have other converter topologies and may be configured as other types of switching converters, such as buck type, boost type, buck-boost type, feed-forward type etc.

In accordance with an exemplary embodiment of the present invention, the switching power converter 100 may further comprise an input buffer coupled between the input port IN and the main switch 101. The input buffer is configured to provide a conduction path for a leak conductor current of the primary winding N1. In the example of FIG. 1, the input buffer is illustrated to comprise a resistor R1, a capacitor C1 and a diode D1, wherein the resistor R1 and the capacitor C1 are connected in parallel and then connected to the diode D1 in series.

In accordance with an exemplary embodiment of the present invention, the switching power converter 100 may further comprise an opto-coupler (not shown in FIG. 1) coupled to the output port OUT, so as to detect the output voltage Vo and to provide a feedback signal Vfb indicative of the output voltage Vo.

In accordance with an exemplary embodiment of the present invention, the control circuit 103 of the switching power converter 100 is configured to control the switch module with peak current control pulse width modulation mode. In an exemplary embodiment, the control circuit 103 is configured to at least provide a pulse width modulated signal PWM to the main switch 101 of the switch module so as to control the on and off switching of the main switch 101. A fraction of time that the main switch 101 is on during the total time of an on and off switching cycle may be referred to as an on duty cycle of the switch module or the power converter 100, denoted by D for example in this disclosure. The control circuit 103 regulates the output voltage Vo through regulating the duty cycle D. In peak current control pulse width modulation mode, the first current sense signal Vcs1 may be provided through sensing a switching current $I_H$ flowing through the main switch 101 or the inductor current $I_L$ flowing through the inductive energy storage device 104 (e.g. the current flowing through the primary winding N1 of the transformer in FIG. 1). Therefore, the first current sense signal Vcs1 is proportional to the switching current $I_H$ or the inductor current $I_L$ and carries information of a peak value of the switching current $I_H$ or the inductor current $I_L$. Correspondingly, the first current limit threshold Vth1 can be a predetermined value indicative of a maximum allowable peak value of the switching current $I_H$ and or the inductor current $I_L$. Since the output current Io can be considered as an average of the switching current $I_H$ or the inductor current $I_L$, the switching current $I_H$ or the inductor current $I_L$ is actually indicative of the output current Io. Thus, the first current limit threshold Vth1 can actually represent the maximum allowable value of the output current Io.

Figure 2:
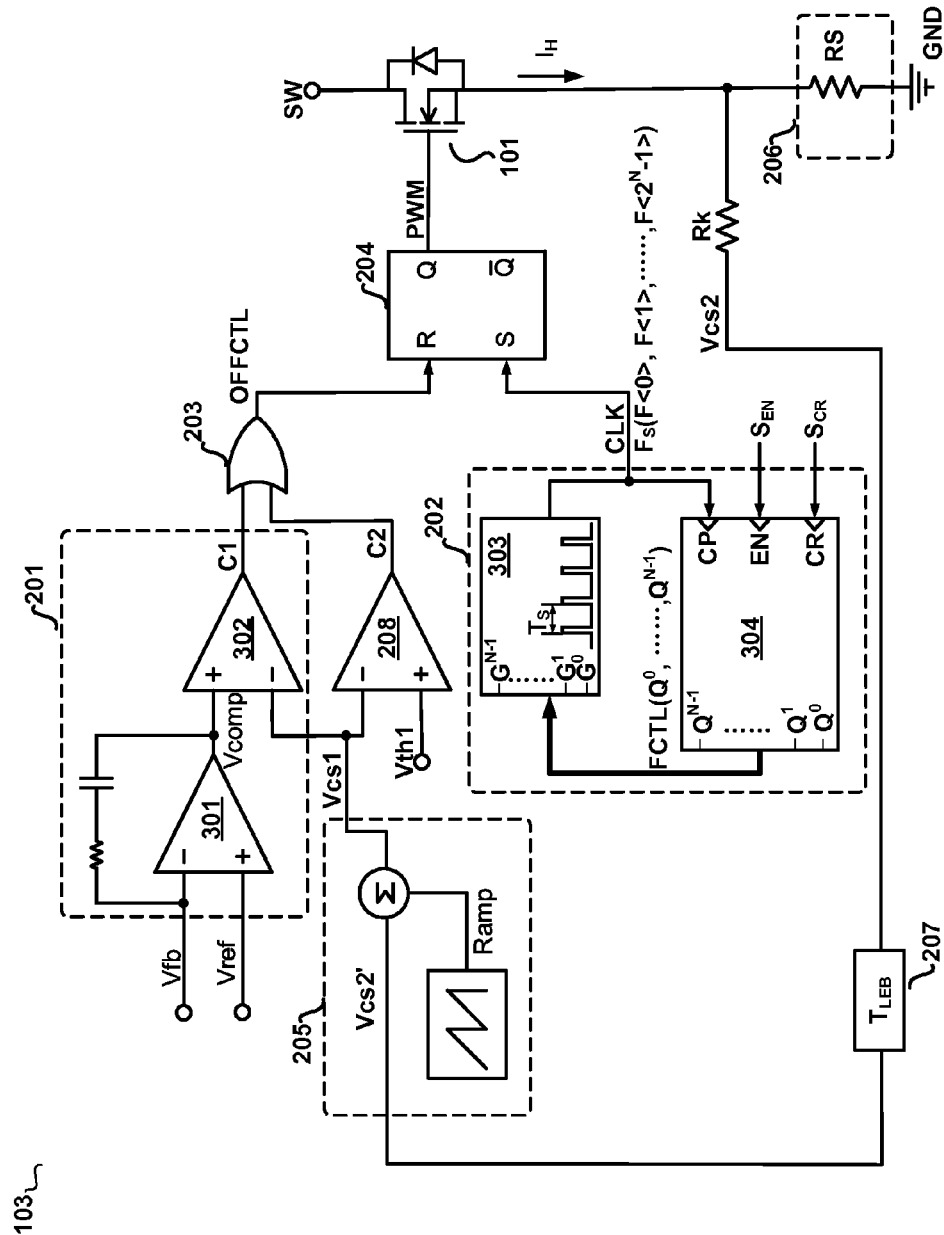
FIG. 2 illustrates a schematic diagram of the control circuit 103 of the switching power converter 100 in accordance with an exemplary embodiment of the present invention.

FIG. 2 illustrates a schematic diagram of the control circuit 103 of the switching power converter 100 in accordance with an exemplary embodiment of the present invention. The power converter 100 and the control circuit 103 will be described in more detail with reference to FIGS. 1 and 2 in the following.

In accordance with an embodiment of the present invention, the control circuit 103 operating with peak current control pulse width modulation mode is configured to operate the feedback signal Vfb with the reference signal to provide a difference signal Vcomp indicative of a difference between the first feedback signal Vfb and the reference signal Vref, and to compare the first current sense signal Vcs1 with the difference signal Vcomp to provide a first comparison signal C1. The control circuit 103 is further configured to compare the first current sense signal Vcs1 with the first current limit threshold Vth1 to provide a second comparison signal C2, and to conduct logic operation to the first comparison signal C1 and the second comparison signal C2 to generate an off trigger signal OFFCTL, wherein the first comparison signal C1 is provided as the off trigger signal OFFCTL when the first current sense signal Vcs1 is lower than the first current limit threshold Vth1, and wherein the second comparison signal C2 is provided as the off trigger signal OFFCTL when the first current sense signal Vcs1 is larger than the first current limit threshold Vth1. The control circuit 103 is further configured to generate the pulse width modulated signal PWM based on the off trigger signal OFFCTL and a clock signal CLK having a sequence of clock pulses and a clock frequency $F_S$, wherein the pulse width modulated signal PWM is configured to drive the main switch 101 to switch on in response to the clock signal CLK, and to drive the main switch 101 to switch off in response to the off trigger signal OFFCTL. In accordance with an exemplary embodiment of the present invention, for each switching cycle, the clock signal CLK is configured to set the beginning of a pulse of the pulse width modulated signal PWM while the off trigger signal OFFCTL is configured to set the end of the pulse of the pulse width modulated signal PWM. In this way, the pulse width of the pulse width modulated signal PWM is regulated cycle by cycle. In an embodiment, the pulse width modulated signal PWM is configured to drive the main switch 101 to maintain on within the pulse duration of the pulse width modulated signal PWM, and to drive the main switch 101 to maintain off hors the pulse duration of the pulse width modulated signal PWM. In this circumstance, the pulse width modulated signal PWM is actually configured to switch the main switch 101 on every time a pulse of the clock signal CLK comes, and switch the main switch 101 off every time a pulse of the off trigger signal OFFCTL comes. Therefore, the main switch 101 is switched on and off periodically to regulate the duty cycle D of each switching cycle so as to regulate the output voltage Vo. The frequency $F_S$ of the clock signal CLK can actually determine the on and off switching frequency of the switch module (e.g. the switching frequency of the main switch 101 and the second switch 102), i.e. the main operating frequency of the switching power converter 100.

Generally when the switching power converter 100 is powered on, i.e. when the input port IN is just coupled to the input voltage Vin, the output voltage Vo can not be rapidly regulated to its steady state desired value. The output voltage Vo at this beginning period is relatively quite low (e.g. at the reference ground potential) in comparison with the desired steady state value. Therefore, the switching power converter 100 generally has a startup procedure, during which the output voltage Vo is regulated to increase gradually from the reference ground potential to its desired steady state value. The startup procedure begins at the moment when the switching power converter 100 is powered on and ends when the output voltage Vo arrives at its desired steady state value. In accordance with an embodiment of the present invention, the switching power converter 100 may comprise a softstart module, configured to set the startup procedure to have a predetermined startup duration. The softstart module is coupled to the control circuit 103 to control the reference signal Vref to gradually increase from the reference ground potential to its steady state value through the predetermined startup duration, or to control the first current limit threshold Vth1 to increase gradually from the reference ground potential to its steady state value through the predetermined startup duration, so that the control circuit 103 can regulate the output voltage Vo to increase gradually to the desired steady state value. The softstart module is decoupled from the control circuit 103 when the softstart procedure is completed.

In accordance with an embodiment of the present invention, the control circuit 103 may be further configured to generate the clock signal CLK and to regulate the clock frequency $F_S$ so as to improve the performance of the switching power converter 100 during the startup procedure. In accordance with an embodiment of the present invention, referring to the illustration of FIG. 2, the control circuit 103 may comprise a clock module 202. The clock module 202 is configured to provide the clock signal CLK having the sequence of clock pulses and the clock frequency $F_S$ is a reciprocal of a pulse period $T_S$ of the clock pulses. The clock module 202 is further configured to set the clock frequency $F_S$ to a first predetermined frequency FS1 (i.e. a startup frequency) at the beginning of the startup procedure, and to regulate the clock frequency $F_S$ to change to a second predetermined frequency FS2 through a predetermined times of step type frequency increase during the startup procedure. In an embodiment, the predetermined times can be $(2^N-1)$ times, wherein N is a positive integer, for example. The second predetermined frequency FS2 is the main operating frequency of the switching power converter 100 when the startup procedure ends and the switching power converter 100 enters into steady state operation. That is to say, after the startup procedure, the control circuit 103 is configured to drive the switch module (e.g. including the main switch 101 and the second switch 102) to switch on and off with the second predetermined frequency FS2. The second predetermined frequency FS2 can be chosen according to various design specifications of the switching power converter 100.

In accordance with an exemplary embodiment of the present invention, the second predetermined frequency FS2 is set to be a multiple of the first predetermined frequency FS1 with a first predetermined multiple factor K, wherein the first predetermined multiple factor K is larger than 1. At each time of step type frequency increase, the clock frequency $F_S$ may be increased by a predetermined frequency increment of that time. In an exemplary embodiment, the predetermined frequency increment of each time of the frequency increase may be a multiple of the first predetermined frequency FS1 with a second predetermined multiple factor corresponding to that time of the frequency increase. One of ordinary skill in the art should understand that the predetermined frequency increment of each time of the step type frequency increase can be either the same as or different from that of last time's step type frequency increase. In other words, the second predetermined multiple factor for each time of the step type frequency increase can be either the same as or different from that of last time's, which can be designed according to practical application requirements. In accordance with an exemplary embodiment of the present invention, for each time of the step type frequency increase, the clock frequency $F_S$ is at a pre-increase frequency prior to the step type frequency increase, and is at a post-increase frequency after the step type frequency increase. The clock module 202 is further configured to set the pre-increase frequency for the first time of step type frequency increase to the first predetermined frequency FS1, and to set the post-increase frequency for the last time of step type frequency increase at the second predetermined frequency FS2. In accordance with an exemplary embodiment of the present invention, the clock module 202 is further configured to regulate the pre-increase frequency for each time of step type frequency increase to last for a predetermined duration. One of ordinary skill in the art should understand that the predetermined duration for each pre-increase frequency can be either the same or different.

Figure 3:
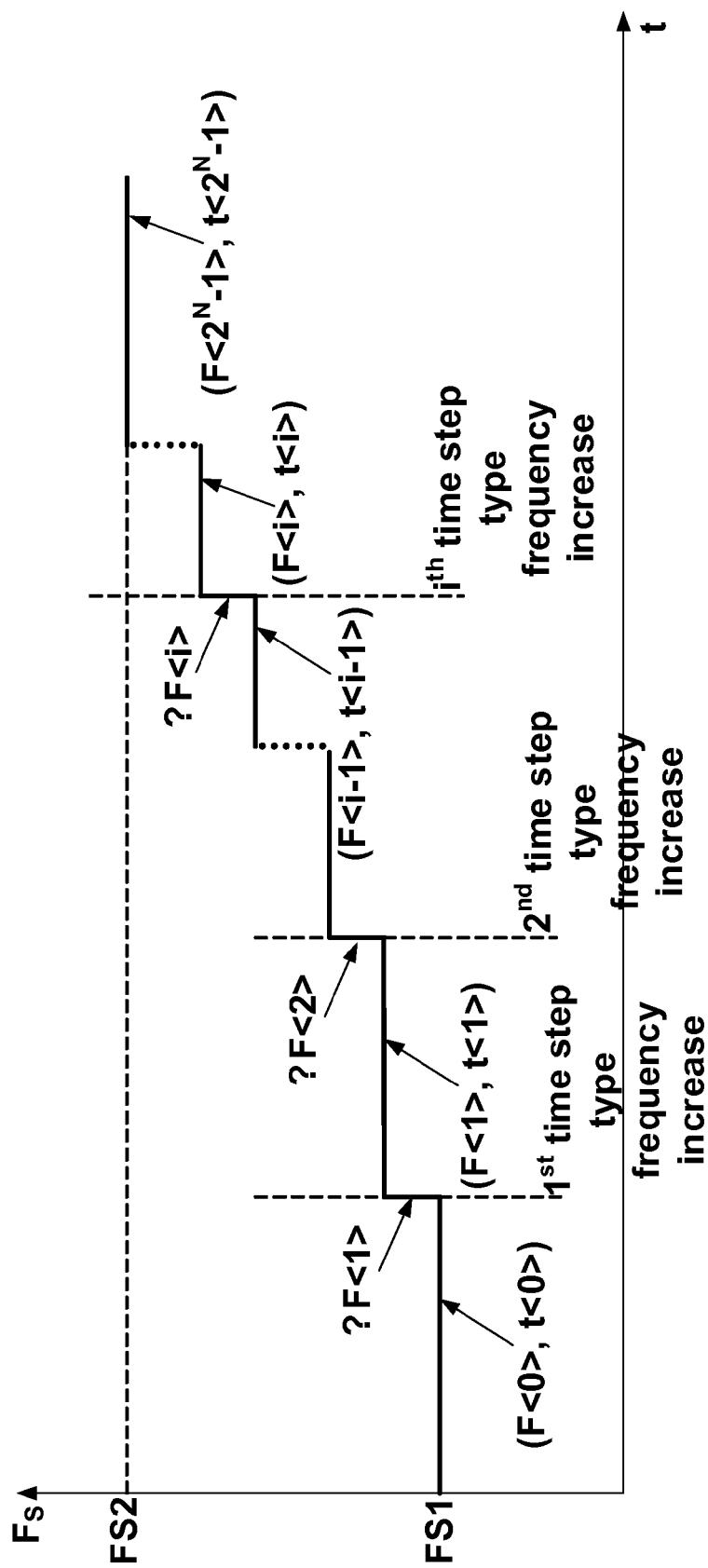
FIG. 3 illustrates a waveform diagram illustrating the change of the clock frequency $F_S$ with the time t in accordance with an exemplary embodiment of the present invention.

To provide an example, the predetermined times are set to $(2^N-1)$ times, wherein N is a positive integer, i.e. in this example, the clock frequency $F_S$ is regulated to change from the first predetermined frequency FS1 to the second predetermined frequency FS2 through $(2^N-1)$ times of step type frequency increase during the startup procedure. For the $i^{th}$ time of step type frequency increase, wherein i can be from 1 to $(2^N-1)$, the corresponding predetermined frequency increment is referred to as the $i^{th}$ time predetermined frequency increment and is denoted by $\Delta F<i>$, and the corresponding second predetermined multiple factor is referred to as the $i^{th}$ time second predetermined multiple factor and is denoted by $K<i>$ (i.e. the $i^{th}$ time predetermined frequency increment $\Delta F<i>$ is a multiple of the first predetermined frequency FS1 with the $i^{th}$ time second predetermined multiple factor $K<i>$, and can be expressed by $\Delta F<i>=K<i>*FS1$). For each i=1, 2, . . . , $(2^N-1)$, the pre-increase frequency prior to the $i^{th}$ time of step type frequency increase is referred to as the $i^{th}$ time pre-increase frequency and is denoted by $F<i-1>$, and the post-increase frequency after the $i^{th}$ time of step type frequency increase is referred to as the $i^{th}$ time post-increase frequency and is denoted by $F<i>$. Now referring to FIG. 3, a waveform diagram illustrating the change of the clock frequency $F_S$ with the time t is shown. For each i=1, 2, . . . , $(2^N-1)$, the $i^{th}$ time predetermined frequency increment $\Delta F<i>$ can be the same as or different from the $(i-1)^{th}$ time predetermined frequency increment $\Delta F<i-1>$, which also means that the $i^{th}$ time second predetermined multiple factor $K<i>$ can be the same as or different from the $(i-1)^{th}$ time second predetermined multiple factor $K<i-1>$. For each i=1, 2, . . . , $(2^N-1)$, the $i^{th}$ time pre-increase frequency $F<i-1>$ is regulated to last for an $i^{th}$ time predetermined duration denoted by $t<i-1>$, wherein the first time pre-increase frequency $F<0>$ is set to the first predetermined frequency FS1 and is regulated to last for a first time predetermined duration $t<0>$, and the $(2^N-1)^{th}$ time post-increase frequency $F<2^N-1>$ (i.e. the post-increase frequency for the last time of step type frequency increase) is set to the second predetermined frequency FS2. For each i=2, . . . , $(2^N-1)$, the $i^{th}$ time predetermined duration $t<i-1>$ of the $i^{th}$ time pre-increase frequency $F<i-1>$ can be the same as or different from the $(i-1)^{th}$ time predetermined duration $t<i-2>$ of the $(i-1)^{th}$ time pre-increase frequency $F<i-2>$.

In accordance with an exemplary embodiment of the present invention, referring back to FIG. 2, the clock module 202 that provides the clock signal CLK for the switching power converter 100 may comprise a clock generator 303 and a clock frequency modulator 304. The clock generator 303 may have a clock control terminal or a plurality of clock control terminals (e.g. the N control terminals $G^0$, $G^1$, . . . , $G^{N-1}$ illustrated in FIG. 2) and a clock output terminal. The clock control terminal/the plurality of clock control terminals are configured to receive a frequency regulation signal FCTL. The frequency regulation signal FCTL may have an initial state and a predetermined number (e.g. $2^N-1$) of frequency regulation states, wherein the predetermined number of frequency regulation states are respectively corresponding to the predetermined times (e.g. $2^N-1$ times) of step type frequency increase of the clock signal CLK during the startup procedure. The clock generator 303 is configured to provide the clock signal CLK at the clock output terminal and to regulate the clock frequency $F_S$ based on the frequency regulation signal FCTL so as to set the clock frequency $F_S$ to the first predetermined frequency FS1 at the initial state of the frequency regulation signal FCTL, and to make the clock frequency $F_S$ to conduct a step type frequency increase each time the frequency regulation signal FCTL changes from one frequency regulation state to another frequency regulation state. The clock frequency modulator 304 may have a modulator input terminal CP and a modulator output terminal/a plurality of modulator output terminals (e.g. the N modulator output terminals $Q^0$, $Q^1$, . . . , $Q^{N-1}$ illustrated in FIG. 2), wherein the modulator input terminal is configured to receive the clock signal CLK, and the clock frequency modulator 304 is configured to perform a timing based on the pulses of the clock signal CLK, and to provide the frequency regulation signal FCTL based on the timing.

Referring to the illustration of FIG. 2, the frequency regulation signal FCTL can actually be a bus signal and may comprise N bit signals $Q^0$, $Q^1$, . . . , $Q^{N-1}$. Correspondingly, the modulator output terminal may comprise N modulator output terminals, also labeled by $Q^0$, $Q^1$, . . . , $Q^{N-1}$ for simplicity, the N modulator output terminals are configured to respectively output the N bit signals $Q^0$, $Q^1$, . . . , $Q^{N-1}$. The N bit signals $Q^0$, $Q^1$, . . . , $Q^{N-1}$ may be binary bit signals, wherein each of the N binary bit signals $Q^0$, $Q^1$, . . . , $Q^{N-1}$ may comprise a logic "0" state and a logic "1" state, and wherein the numbers 0, 1, 2 . . . , N−1 on upper right of the letter Q are respectively indicative of the precedence of the N bit signals from lowest to highest, i.e. the number 0 bit signal is $Q^0$, the number 1 bit signal is $Q^1$, and by that analogy, the number (N−1) bit signal is $Q^{N-1}$. Combination of the N binary bit signals $Q^0$, $Q^1$, . . . , $Q^{N-1}$ may generate $2^N$ logic states, wherein one of the $2^N$ logic states may be used as the initial state of the frequency regulation signal FCTL, and the remain $(2^N-1)$ logic states may be used as $(2^N-1)$ frequency regulation states of the frequency regulation signal FCTL. That is to say, the predetermined number of the frequency regulation states for the clock signal CLK is $(2^N-1)$ in this example, which means that the predetermined number of the frequency regulation states can be appropriately set by appropriately choosing the positive integer N.

In accordance with the exemplary embodiment of FIG. 2, for each i=1, 2, . . . , $2^N-1$, the clock frequency modulator 304 is configured to perform a timing to the $i^{th}$ time pre-increase frequency F<i-1> based on the pulses of the clock signal CLK until the timing reaches the $i^{th}$ time predetermined duration t<i-1>. Once the timing is equal to the $i^{th}$ time predetermined duration t<i-1>, the clock frequency modulator 304 is configured to change the combination of the N binary bit signals $Q^0, Q^1, \ldots, Q^{N-1}$ from one logic state to another among the $2^N$ logic states, i.e. the frequency regulation signal FCTL is changed from one frequency regulation state to another. Meanwhile, the frequency regulation signal FCTL controls the clock generator 303 to regulate the clock frequency $F_S$ of the clock signal CLK to perform the $i^{th}$ time step type frequency increase. In this way, with the index i changing from 1 to $(2^N-1)$, the frequency regulation signal FCTL can regulate the clock frequency $F_S$ to perform $(2^N-1)$ times of step type frequency increase, and a total time T taken for performing the $(2^N-1)$ times of step type frequency increase actually equals a sum of the predetermined durations of all the $(2^N-1)$ pre-increase frequencies F<i-1> (i=1, 2, . . . , $2^N-1$), i.e.

$$T = \sum_{i=1}^{2^N-1} t\langle i-1 \rangle.$$

The total time T should be smaller than or at most equal to the predetermined startup duration of the switching power converter 100. In accordance with an exemplary embodiment of the present invention, the clock frequency modulator 304 is configured to change the combination of the N binary bit signals $Q^0, Q^1, \ldots, Q^{N-1}$ from one logic state to another among the $2^N$ logic states (i.e. change the frequency regulation signal FCTL from one frequency regulation state to another) in response to every M pulses of the clock signal CLK, wherein M is a positive integer. That is to say, for each i=1, 2, . . . , $2^N-1$, every time the timing performed by the frequency modulator 304 to the $i^{th}$ time pre-increase frequency F<i-1> based on the pulses of the clock signal CLK reaches M times of a frequency period $T_S$<i-1> (referred to as the $i^{th}$ time pre-increase clock period in the following) corresponding to the $i^{th}$ time pre-increase frequency F<i-1>, the frequency modulator 304 is configured to change the combination of the N binary bit signals $Q^0, Q^1, \ldots, Q^{N-1}$ from one logic state to another among the $2^N$ logic states so as to regulate the clock frequency $F_S$ of the clock signal CLK to perform the $i^{th}$ time step type frequency increase. In other words, the $i^{th}$ time predetermined duration t<i-1> is set to be M times of the $i^{th}$ time pre-increase clock period $T_S$<i-1> in this example, i.e. t<i-1>=M*$T_S$<i-1>=M/F<i-1>.

In accordance with an embodiment of the present invention, still referring to FIG. 2, the clock frequency modulator 304 may further comprise an enable input terminal EN. This enable input terminal EN is configured to receive an enable signal $S_{EN}$, wherein the enable signal $S_{EN}$ is configured to activate the clock frequency modulator 304 (i.e. make the clock frequency modulator 304 to start to operate) at the moment when the switching power converter 100 is powered on, and is configured to deactivate the clock frequency modulator 304 (i.e. make the clock frequency modulator 304 to stop operating) at the moment when the clock frequency $F_S$ is increased to the second predetermined frequency FS2 so that the clock frequency $F_S$ is maintained at the second predetermined frequency FS2 thereafter. For instance, when the clock frequency modulator 304 is deactivated, it stops performing the timing and thus stops changing the logic state of the combination of the N binary bit signals $Q^0, Q^1, \ldots, Q^{N-1}$ (i.e. the frequency regulation signal FCTL is maintained at a certain frequency regulation state which is corresponding to the second predetermined frequency FS2). Therefore, after the deactivation of the clock frequency modulator 304, the clock generator 303 maintains the clock frequency $F_S$ at the second predetermined frequency FS2 in response to the frequency regulation signal FCTL.

In accordance with an embodiment of the present invention, still referring to FIG. 2, the clock frequency modulator 304 may further comprise a reset input terminal CR. The reset input terminal CR is configured to receive a reset signal $S_{CR}$, wherein the reset signal $S_{CR}$ is configured to reset the clock frequency modulator 304 at the moment when the switching power converter 100 is powered on, so that the output of the clock frequency modulator 304 is restored to the initial state, i.e. the frequency regulation signal FCTL is restored to the initial state with the N bit signals $Q^0, Q^1, \ldots, Q^{N-1}$ respectively restored to their initial logic states.

Figure 4:
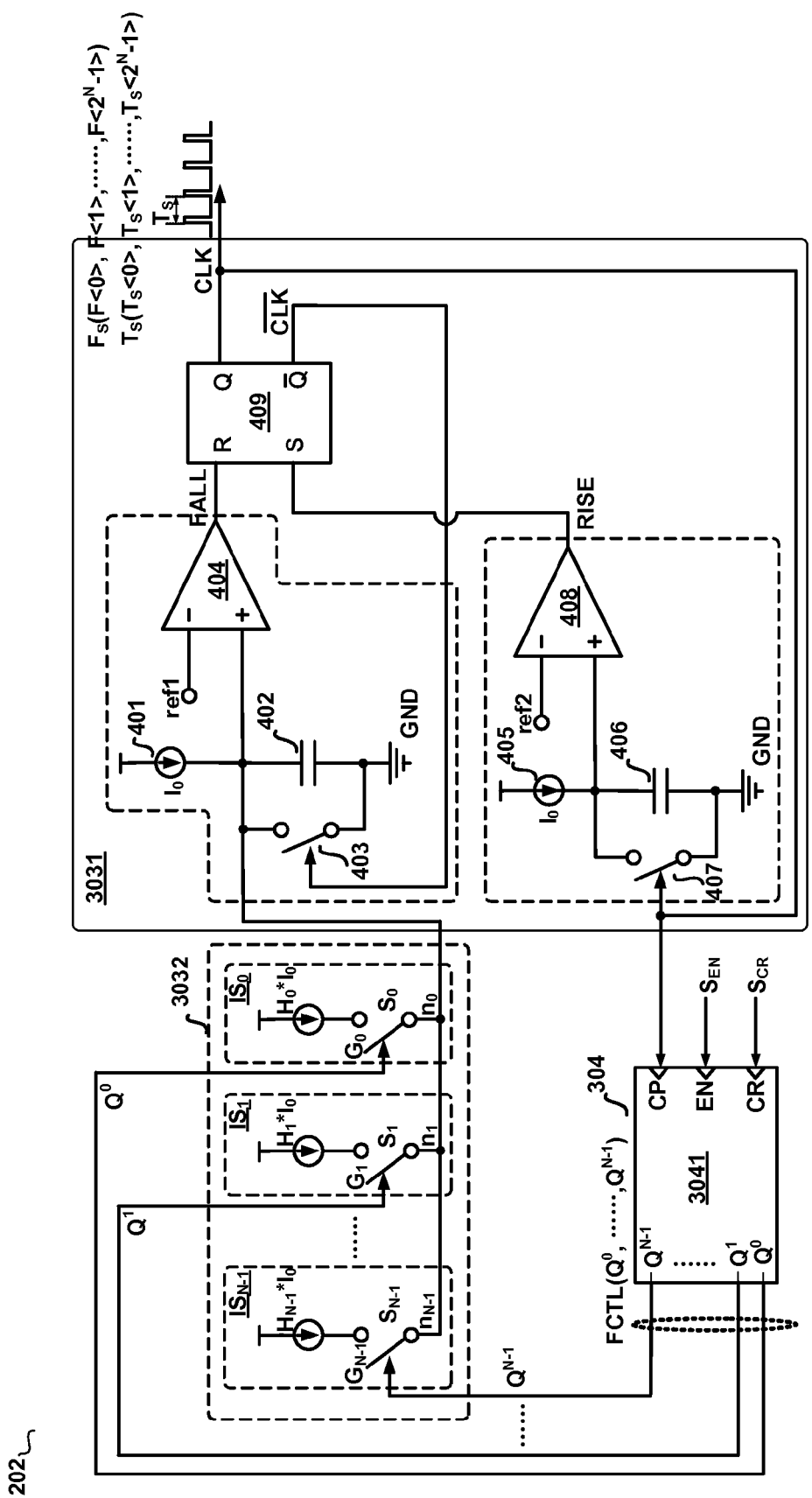
FIG. 4 illustrates a schematic diagram of the clock module 202 of the switching power converter 100 in accordance with an exemplary embodiment of the present invention.

FIG. 4 illustrates a schematic diagram of the clock module 202 of the switching power converter 100 in accordance with an exemplary embodiment of the present invention. In this example, the clock frequency modulator 304 may comprise an N-bit binary counter 3041, wherein N is a positive integer. The N-bit binary counter 3041 is configured to provide the frequency regulation signal FCTL having $2^N$ logic states, including an initial state and $(2^{N-1})$ frequency regulation states. The N-bit binary counter 3041 has a clock input terminal CP and N-bit output terminals $Q^0, Q^1, \ldots, Q^{N-1}$, wherein the clock input terminal CP is configured to receive the clock signal CLK, and wherein the N-bit output terminals $Q^0, Q^1, \ldots, Q^{N-1}$ are respectively coupled to the $0^{th}$ to the $(N-1)^{th}$ bit output terminals from the lowest precedence to the highest precedence, and are respectively configured to output the $0^{th}$ to the $(N-1)^{th}$ binary bit signals $Q^0, Q^1, \ldots, Q^{N-1}$ of the N-bit binary counter 3041. Each of the N binary bit signals $Q^0, Q^1, \ldots, Q^{N-1}$ may comprise a logic "0" state and a logic "1" state, Therefore the combination of the N binary bit signals $Q^0, Q^1, \ldots, Q^{N-1}$ may have $2^N$ logic states, wherein one of the $2^N$ logic states may be set as the initial state of the frequency regulation signal FCTL, and the remain $(2^N-1)$ logic states may be used as the $(2^{N-1})$ frequency regulation states of the frequency regulation signal FCTL.

In accordance with an exemplary embodiment of the present invention, still referring to FIG. 4, the N-bit binary counter 3041 is configured to perform a counting, i.e. to change the logic state of the combination of the N binary bit signals $Q^0, Q^1, \ldots, Q^{N-1}$ for once (from one logic state to another among the $2^N$ logic states) in response to each pulse of the clock signal CLK, starting from the initial state. In this circumstance, every time one clock period $T_S$ elapses, the logic state of the combination of the N binary bit signals $Q^0, Q^1, \ldots, Q^{N-1}$ changes for once (i.e. the frequency regulation state of the frequency regulation signal FCTL changes for once), thus in response to each change of the frequency regulation state of the clock frequency regulation signal FCTL, the clock generator 303 regulates the clock frequency $F_S$ to perform a step type frequency increase. After all the $(2^{N-1})$ frequency regulation states of the clock frequency regulation signal FCTL have been ergodically excuted, $(2^N-1)$ times of step type frequency increase are correspondingly performed and the clock frequency $F_S$ has been increased from the first predetermined frequency FS1 to the second predetermined frequency FS2. Therefore, in this example where the N-bit binary counter 3041 performs a counting in response to each pulse of the clock signal CLK, for each i=1, 2, . . . , $2^N$–1, the $i^{th}$ time predetermined duration t<i–1> that the $i^{th}$ time pre-increase frequency F<i–1> lasts is actually set to be the $i^{th}$ time pre-increase clock period $T_S$<i–1>, i.e. t<i–1>=$T_S$<i–1>=1/F<i–1>, wherein the $1^{st}$ time pre-increase frequency F<0> is set to the first predetermined frequency FS1, and the $1^{st}$ time predetermined duration t<0> that the $1^{st}$ time pre-increase frequency F<0> lasts is equal to $T_S$<0>, i.e. t<0>=1/F<0>=1/FS1. After ($2^N$–1) times of step type frequency increase, the $(2^N$–1$)^{th}$ time post-increase frequency F<$2^N$–1> is set to be the second predetermined frequency FS2, i.e. F<$2^N$–1>=FS2. Those skilled in the art should understand that, in practical applications, the $i^{th}$ time predetermined duration t<i–1> that the $i^{th}$ time pre-increase frequency F<i–1> lasts may be required to be larger than one clock period $T_S$<i–1>. For example, in one embodiment, it is desired that the $i^{th}$ time predetermined duration t<i–1> (for each i=1, 2, . . . , $2^N$–1) should be M times of the corresponding $i^{th}$ time pre-increase clock period $T_S$<i–1>, i.e. it is desired that t<i–1>=M*$T_S$<i–1>, wherein M is a positive integer. One of ordinary skill in the art should understand that this can be achieved by configuring the N-bit binary counter 3041 to perform a counting in response to every M pulses of the clock signal CLK.

Figure 5:
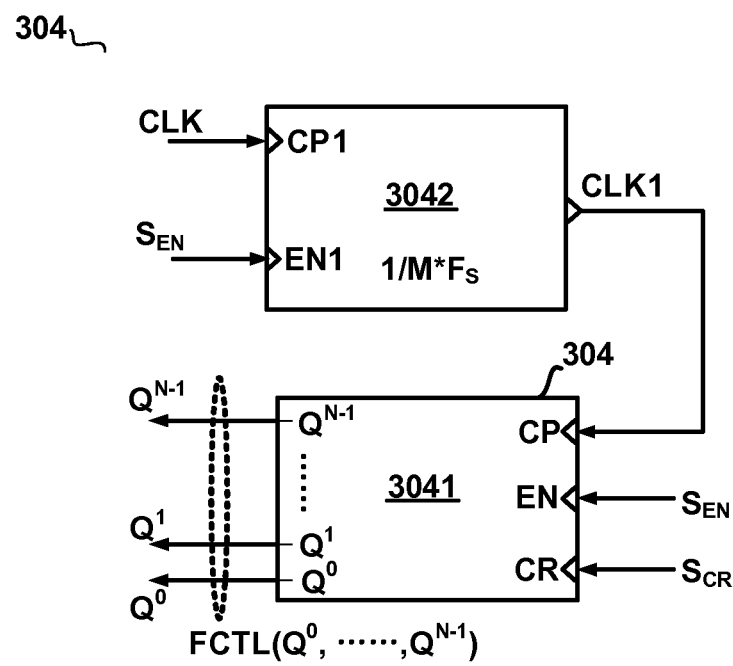
FIG. 5 illustrates a schematic diagram of a clock frequency modulator 304 that can be used in the examples of FIG. 2 and FIG. 4 in accordance with an alternative embodiment of the present invention.

For instance, FIG. 5 illustrates a schematic diagram of a clock frequency modulator 304 that can be used in the examples of FIG. 2 and FIG. 4 in accordance with an alternative embodiment of the present invention. In this example, the clock frequency modulator 304 may further comprise a frequency divider 3042. The frequency divider 3042 may have a frequency dividing input terminal CP1 and a frequency dividing output terminal CLK1, wherein the frequency dividing input terminal CP1 is configured to receive the clock signal CLK, and wherein the frequency divider 3042 is configured to divide the frequency $F_S$ of the clock signal CLK with 1/M so as to generate a frequency divided signal, also labeled with CLK1, wherein M is a positive integer. It can be understood that, when M is set to 1, i.e. M=1, the frequency divided signal CLK1 is the same as the clock signal CLK, thus the frequency divider 3042 can be omitted (referring to the embodiment shown in FIG. 4). In the example of FIG. 5, the clock input terminal of the N-bit binary counter 3041 is configured to receive the frequency divided signal CLK1, the N-bit binary counter 3041 is configured to perform a counting, i.e. to change the logic state of the combination of the N binary bit signals $Q^0$, $Q^1$, . . . , $Q^{N-1}$ for once (from one logic state to another among the $2^N$ logic states) in response to each pulse of the frequency divided signal CLK1 (actually in response to every M pulses of the clock signal CLK), starting from the initial state. In this circumstance, every time M clock periods $T_S$ elapse, the logic state of the combination of the N binary bit signals $Q^0$, $Q^1$, . . . , $Q^{N-1}$ changes for once (i.e. the frequency regulation state of the frequency regulation signal FCTL changes for once), thus in response to each change of the frequency regulation state of the clock frequency regulation signal FCTL, the clock generator 303 regulates the clock frequency $F_S$ to perform a step type frequency increase. After all the ($2^N$–1) frequency regulation states of the clock frequency regulation signal FCTL have been ergodically executed, ($2^N$–1) times of step type frequency increase are correspondingly performed and the clock frequency $F_S$ has been increased from the first predetermined frequency FS1 to the second predetermined frequency FS2. Therefore, in this example where the N-bit binary counter 3041 performs a counting in response to every M pulses of the clock signal CLK, for each i=1, 2, . . . , $2^N$–1, the $i^{th}$ time predetermined duration t<i–1> that the $i^{th}$ time pre-increase frequency F<i–1> lasts is actually set to be M times of the $i^{th}$ time pre-increase clock period $T_S$<i–1>, i.e. t<i–1>=M*$T_S$<i–1>=M/F<i–1>, wherein the $1^{st}$ time pre-increase frequency F<0> is set to the first predetermined frequency FS1, and the $1^{st}$ time predetermined duration t<0> that the $1^{st}$ time pre-increase frequency F<0> lasts is equal to M*$T_S$<0>, i.e. t<0>=M/F<0>=M/FS1. After ($2^N$–1) times of step type frequency increase, the $(2^N$–1$)^{th}$ time post-increase frequency F<$2^N$–1> is set to be the second predetermined frequency FS2, i.e. F<$2^N$–1>=FS2. Those skilled in the art should understand that, in practical applications, the $i^{th}$ time predetermined duration t<i–1> that the $i^{th}$ time pre-increase frequency F<i–1> lasts may be appropriately chosen by modifying the integer M.

In accordance with an embodiment of the present invention, still referring to FIG. 5, the N-bit binary counter 3041 may further comprise an enable input terminal EN. This enable input terminal EN is configured to receive an enable signal $S_{EN}$, wherein the enable signal $S_{EN}$ is configured to activate the N-bit binary counter 3041 (i.e. make the N-bit binary counter 3041 to start counting) at the moment when the switching power converter 100 is powered on, and is configured to deactivate the N-bit binary counter 3041 (i.e. make the N-bit binary counter 3041 to stop counting) at the moment when the clock frequency $F_S$ is increased to the second predetermined frequency FS2 so that the clock frequency $F_S$ is maintained at the second predetermined frequency FS2 then after. In accordance with an embodiment of the present invention, the N-bit binary counter 3041 may further comprise a reset input terminal CR. The reset input terminal CR is configured to receive a reset signal $S_{CR}$, wherein the reset signal $S_{CR}$ is configured to reset the N-bit binary counter 3041 at the moment when the switching power converter 100 is powered on, so that the outputs of N-bit binary counter 3041 are restored to their initial states, i.e. the frequency regulation signal FCTL is restored to the initial state with the N bit signals $Q^0$, $Q^1$, . . . , $Q^{N-1}$ respectively restored to their initial logic states. In accordance with an embodiment of the present invention, the frequency divider 3042 may also have an enable input terminal EN1 which is configured to receive the enable signal $S_{EN}$. The enable signal $S_{EN}$ may be configured to activate the frequency divider 3042 (i.e. make the frequency divider to start operating) at the moment when the switching power converter 100 is powered on, and to deactivate the frequency divider 3042 (i.e. make the frequency divider to stop operating) at the moment when the clock frequency $F_S$ is increased to the second predetermined frequency FS2.

In accordance with an exemplary embodiment of the present invention, the N-bit binary counter 3041 may comprise an N-bit binary up counter. In this circumstance, each of the N binary bit signals $Q^0$, $Q^1$, . . . , $Q^{N-1}$ output from the $0^{th}$ to the $(N-1)^{th}$ bit output terminals of the N-bit binary up counter 3041 may still comprise a logic "0" state and a logic "1" state, and the combination of the N binary bit signals $Q^0$, $Q^1$, . . . , $Q^{N-1}$ may have a logic "0" initial state and ($2^N$–1) other logic states, wherein the logic "0" initial state means that each of the N binary bit signals $Q^0$, $Q^1$, . . . , $Q^{N-1}$ is at the logic "0" state. The N-bit binary up counter 3041 is configured to perform an up counting in response to each pulse of the clock signal CLK (in the example of FIG. 4) or in response to each pulse of the frequency divided signal CLK1 (in the example of FIG. 5), resulting in the logic state of the combination of the N binary bit signals $Q^0$, $Q^1, \ldots, Q^{N-1}$ changing for once from one logic state to another among the $2^N$ logic states, starting from the logic "0" initial state.

In accordance with an exemplary embodiment of the present invention, the N-bit binary counter 3041 may comprise an N-bit binary down counter. In this circumstance, each of the N binary bit signals $Q^0, Q^1, \ldots, Q^{N-1}$ output from the $0^{th}$ to the $(N-1)^{th}$ bit output terminals of the N-bit binary down counter 3041 may still comprise a logic "0" state and a logic "1" state, and the combination of the N binary bit signals $Q^0, Q^1, \ldots, Q^{N-1}$ may have a logic "1" initial state and $(2^N-1)$ other logic states, wherein the logic "1" initial state means that each of the N binary bit signals $Q^0, Q^1, \ldots, Q^{N-1}$ is at the logic "1" state. The N-bit binary down counter 3041 is configured to perform a down counting in response to each pulse of the clock signal CLK (in the example of FIG. 4) or in response to each pulse of the frequency divided signal CLK1 (in the example of FIG. 5), resulting in the logic state of the combination of the N binary bit signals $Q^0, Q^1, \ldots, Q^{N-1}$ changing for once from one logic state to another among the $2^N$ logic states, starting from the logic "1" initial state.

In accordance with an exemplary embodiment of the present invention, referring back to FIG. 4, the clock generator 303 may comprise a clock generation module 3031 and a controllable current source module 3032. The clock generation module 3031 may at least comprise a constant current source (e.g. 401 in FIG. 4) and a capacitor (e.g. 402 in FIG. 4), and be configured to generate the clock signal CLK at least partially based on charging and discharging of the capacitor (402) by the constant current source (401). The constant current source (401) may be configured to provide a first constant current $I_0$, wherein the first constant current $I_0$ determines the first predetermined frequency FS1. To provide an example, the embodiment shown in FIG. 4 illustrates an implementation circuit of the clock generation module 3031 comprising a pulse falling edge control module, a pulse rising edge control module and a RS trigger module.

The pulse falling edge control module is illustrated to comprise a first constant current source 401, a first capacitor 402, a first controllable switch 403 and a first comparator 404. The first constant current source 401 is configured to provide the first constant current $I_0$. The first capacitor 402 may have a first terminal electrically coupled to the first constant current source 401 to receive the first constant current $I_0$ and a second terminal connected to reference ground GND. The first controllable switch 403 may have a first terminal, a second terminal and a control terminal, wherein the first terminal is electrically coupled to the first terminal of the first capacitor 402, and wherein the second terminal is connected to the reference ground GND. The first comparator 404 may have a first input terminal, a second input terminal and an output terminal, wherein the first input terminal (e.g. the "−" input terminal of 404 in FIG. 4) is configured to receive a falling edge reference signal ref1, and wherein the second input terminal (e.g. the "+" input terminal of 404 in FIG. 4) is electrically coupled to the first terminal of the first capacitor 402 to receive a first capacitor voltage signal across the first capacitor 402. The first comparator 404 is configured to compare the first capacitor voltage signal across the first capacitor 402 with the falling edge reference signal ref1 to provide a falling edge trigger signal FALL.

The pulse rising edge control module is illustrated to comprise a second constant current source 405, a second capacitor 406, a second controllable switch 407 and a second comparator 408. The second constant current source 405 may also be configured to provide the first constant current $I_0$. In this case, the first constant current source 401 and the second constant current source 405 can be the same and one of them can be omitted. The second capacitor 406 may have a first terminal electrically coupled to the second constant current source 405 to receive the first constant current $I_0$ and a second terminal connected to the reference ground GND. The second controllable switch 407 may have a first terminal, a second terminal and a control terminal, wherein the first terminal is electrically coupled to the first terminal of the second capacitor 406, and wherein the second terminal is connected to the reference ground GND. The second comparator 408 may have a first input terminal, a second input terminal and an output terminal, wherein the first input terminal (e.g. the "−" input terminal of 408 in FIG. 4) is configured to receive a rising edge reference signal ref2, and wherein the second input terminal (e.g. the "+" input terminal of 408 in FIG. 4) is electrically coupled to the first terminal of the second capacitor 406 to receive a second capacitor voltage signal across the second capacitor 406. The second comparator 408 is configured to compare the second capacitor voltage signal across the second capacitor 406 with the rising edge reference signal ref2 to provide a rising edge trigger signal RISE.

The RS trigger module is illustrated to comprise a RS flip-flop 409 having a reset input terminal "R", a set input terminal "S", a non-inverse output terminal Q and an inverse output terminal $\overline{Q}$, wherein the reset input terminal "R" is configured to receive the falling edge trigger signal FALL, the set input terminal "S" is configured to receive the rising edge trigger signal RISE, the non-inverse output terminal Q is configured to provide the clock signal CLK, and the inverse output terminal $\overline{Q}$ is configured to provide a second clock signal $\overline{CLK}$ which is logically complementary with the clock signal CLK, i.e. when the clock signal CLK is at logic high (logic "1"), the second clock signal $\overline{CLK}$ is at logic low (logic "0"), and when the clock signal CLK is at logic low (logic "0"), the second clock signal $\overline{CLK}$ is at logic high (logic "1").

In accordance with an embodiment of the present invention, the clock signal CLK is provided to the control terminal of the second controllable switch 405, whereas the second clock signal $\overline{CLK}$ is provided to the control terminal of the first controllable switch 403. In this way, if the clock signal CLK is logic high, the second controllable switch 407 is turned on to discharge the second capacitor 406, in the meanwhile, the second clock signal $\overline{CLK}$ is logic low and controls the first controllable switch 405 to turn off thereby allowing the first constant current source 401 to charge the first capacitor 402 with the first constant current $I_0$. When the first capacitor voltage across the first capacitor 402 is charged to be higher than the falling edge reference signal ref1, the first comparator 404 changes the logic state of the falling edge trigger signal FALL, e.g. from logic low to logic high. Consequently, the falling edge trigger signal FALL triggers the RS flip-flop 409 to reset so that the clock signal CLK is changed from logic high to logic low. If the clock signal CLK is logic low, the second controllable switch 407 is turned off. Thus, the second constant current source 405 (or the first constant current source 401 in the example where the first and the second current source are the same one) charges the second capacitor 406. In the meanwhile, the second clock signal $\overline{CLK}$ is logic high and controls the first controllable switch 405 to turn on thereby discharging the first capacitor 402 with the first constant current $I_0$. When the first capacitor voltage across the first capacitor 402. When the second capacitor voltage across the second capacitor 406 is charged to be higher than the rising edge reference signal ref2, the second comparator 408 changes the logic state of the rising edge trigger signal RISE, e.g. from logic low to logic high. Consequently, the rising edge trigger signal RISE triggers the RS flip-flop 409 to set so that the clock signal CLK is changed from logic low to logic high. The charging and discharging of the first capacitor 402 and the second capacitor 403 repeat and thus a sequence of pulses of the clock signal CLK is generated at the non-inverse output terminal Q of the RS flip-flop 409. The first constant current $I_0$ determines the base frequency of the clock signal CLK, i.e. the first determined frequency FS1.

The controllable current source module 3032 may comprise N controllable current sources, respectively referred to as the $0^{th}$ to the $(N-1)^{th}$ controllable current sources and successively labeled with $IS_0, IS_1, \ldots, IS_{N-1}$. Each of the N controllable current sources $IS_0, IS_1, \ldots, IS_{N-1}$ is electrically coupled to the first terminal of the first capacitor 402 and in parallel with the first constant current source 401. For each $j=0, 1, 2, \ldots, N-1$, the $j^{th}$ controllable current source $IS_j$ may have a $j^{th}$ current control terminal $G_j$ and a $j^{th}$ current output terminal $n_j$, wherein the $j^{th}$ current control terminal $G_j$ is configured to receive the $j^{th}$ bit signal $Q^j$ generated at the $j^{th}$ output terminal of the N-bit binary counter 3041. In this way, the $j^{th}$ bit signal $Q^j$ can be configured to control the $j^{th}$ controllable current source $IS_j$ to provide a $j^{th}$ current $I<j>$ to the $j^{th}$ current output terminal $n_j$ in response to one of the logic "0" and logic "1" states of the $j^{th}$ bit signal $Q^j$, wherein the $j^{th}$ current $I<j>$ is set to be a multiple of the first constant current $I_0$ with a $j^{th}$ predetermined current multiple factor $H_j$, and can be expressed by $I<j>=H_j*I_0$. In an exemplary embodiment wherein the N-bit binary counter 3041 is an N-bit binary up counter, for each $j=0, 1, 2, \ldots, N-1$, the $j^{th}$ bit signal $Q^j$ is configured to control the $j^{th}$ controllable current source $IS_j$ to provide the $j^{th}$ current $I<j>$ to the $j^{th}$ current output terminal $n_j$ in response to the logic "1" state of the $j^{th}$ bit signal $Q^j$. In an exemplary embodiment wherein the N-bit binary counter 3041 is an N-bit binary down counter, for each $j=0, 1, 2, \ldots, N-1$, the $j^{th}$ bit signal $Q^j$ is configured to control the $j^{th}$ controllable current source $IS_j$ to provide the $j^{th}$ current $I<j>$ to the $j^{th}$ current output terminal $n_j$ in response to the logic "0" state of the $j^{th}$ bit signal $Q^j$. In accordance with an exemplary embodiment of the present invention, for each $j=0, 1, 2, \ldots, N-1$, the $j^{th}$ controllable current source $IS_j$ may comprise a $j^{th}$ constant current source and a $j^{th}$ controllable switch $S_j$ electrically coupled in series, wherein the $j^{th}$ constant current source is configured to provide the $j^{th}$ current $I<j>=H_j*I_0$.

In view of the above descriptions, in the example where the N-bit binary counter 3041 is an N-bit binary up counter, the N-bit binary counter 3041 is activated at the moment when the switching power converter 100 is powered on and is set to have the logic "0" initial state (i.e. each of the N binary bit signals $Q^0, Q^1, \ldots, Q^{N-1}$ is at the logic "0" state). Thus, at the moment when the switching power converter 100 is powered on, none of the N controllable current sources $IS_0, IS_1, \ldots, IS_{N-1}$ of the controllable current source module 3032 provides current to the first capacitor 402, and thus the clock frequency $F_S$ of the clock signal CLK is at the first predetermined frequency FS1, i.e. the first pre-increase frequency $F<0>=FS1$. After 1 clock period $T_S<0>$ for the example of FIG. 4 or M clock periods $M*T_S<0>$ for the example of FIG. 5, the N-bit binary up counter 3041 performs a first up counting, and thus the $0^{th}$ bit signal $Q^0$ changes from logic "0" state to logic "1" state while the $1^{st}$ to the $(N-1)^{th}$ bit signals $Q^1, \ldots, Q^{N-1}$ remains at the logic "0" state. Consequently, the $0^{th}$ controllable current source $IS_0$ in the controllable current source module 3032 provides the $0^{th}$ current $I<0>=H_0*I_0$ at the $0^{th}$ current output terminal $n_0$ in response to the logic "1" state of the $0^{th}$ bit signal $Q^0$. Therefore, the $0^{th}$ current $I<0>=H_0*I_0$ inflows to the first terminal of the first capacitor 402, resulting in the clock frequency $F_S$ performing the $1^{st}$ time of step type frequency increase, wherein the corresponding $1^{st}$ time predetermined frequency increment $\Delta F<1>=H_0*FS1$, and the corresponding $1^{st}$ time second predetermined multiple factor $K<1>=H_0$, the $1^{st}$ time post-increase frequency $F<1>=F<0>+\Delta F<1>=(H_0+1)*FS1$. After another 1 clock period $T_S<0>$ for the example of FIG. 4 or another M clock periods $M*T_S<0>$ for the example of FIG. 5, the N-bit binary up counter 3041 performs a second up counting, and thus the $0^{th}$ bit signal $Q^0$ changes from logic "1" state to logic "0" state, the $1^{st}$ bit signal $Q^1$ changes from logic "0" state to logic "1" state, while the $2^{nd}$ to the $(N-1)^{th}$ bit signals $Q^2, \ldots, Q^{N-1}$ remains at the logic "0" state. Consequently, the $0^{th}$ controllable current source $IS_0$ in the controllable current source module 3032 stops providing the $0^{th}$ current $I<0>=H_0*I_0$ at the $0^{th}$ current output terminal $n_0$ in response to the logic "0" state of the $0^{th}$ bit signal $Q^0$ while the $1^{st}$ controllable current source $IS_1$ provides the $1^{st}$ current $I<1>=H_1*I_0$ at the $1^{st}$ current output terminal $n_1$ in response to the logic "1" state of the $1^{st}$ bit signal $Q^1$. Therefore, the $1^{st}$ current $I<1>=H_1*I_0$ inflows to the first terminal of the first capacitor 402, resulting in the clock frequency $F_S$ performing the $2^{nd}$ time of step type frequency increase, wherein the corresponding $2^{nd}$ time predetermined frequency increment $\Delta F<2>=(H_1-H_0)*FS1$, and the corresponding $2^{nd}$ time second predetermined multiple factor $K<2>=H_1-H_0$, the $2^{nd}$ time post-increase frequency $F<2>=F<1>+\Delta F<2>=(H_1+1)*FS1$. By that analogy, referring to Table 1, when the N-bit binary up counter 3041 performs a third up counting, the controllable current source module 3032 provides the $1^{st}$ current $I<1>=H_1*I_0$ and the $0^{th}$ current $I<0>=H_0*I_0$ to the first capacitor 402, resulting in the clock frequency $F_S$ performing the $3^{rd}$ time of step type frequency increase, wherein the corresponding $3^{rd}$ time predetermined frequency increment $\Delta F<3>=H_0*FS1$, and the corresponding $3^{rd}$ time second predetermined multiple factor $K<3>=H_0$, the $3^{rd}$ time post-increase frequency $F<3>=(H_1+H_0+1)*FS1$. when the N-bit binary up counter 3041 performs a $(2^N-1)^{th}$ up counting, the controllable current source module 3032 provides the $(N-1)^{th}$ to the $0^{th}$ currents $I<N-1>=H_{N-1}*I_0$, $I<N-2>=H_{N-2}*I_0, \ldots, I<0>=H_0*I_0$ to the first capacitor 402, resulting in the clock frequency $F_S$ performing the $(2^N-1)^{th}$ time of step type frequency increase, wherein the corresponding $(2^N-1)^{th}$ time predetermined frequency increment $\Delta F<2^N-1>=H_0*FS1$, and the corresponding $(2^N-1)^{th}$ time second predetermined multiple factor $K<2^N-1>=H_0$, the $(2^N-1)^{th}$ time post-increase frequency $F<2^N-1>=(H_{N-1}+H_{N-2}+\ldots+H_1+H_0+1)*FS1$. Therefore, the first predetermined multiple factor $K=(H_{N-1}+H_{N-2}+\ldots+H_1+H_0+1)$. Those having ordinary skill in the art would understand that if the first predetermined multiple factor K is given, each frequency increment $\Delta F<i>$ (for $i=1, 2, \ldots, 2^N-1$) can be set by appropriately choosing each of the multiple current factors $H_j$ (for $j=0, 1, 2, \ldots, N-1$). It should be noted that, the choosing of the multiple current factors $H_j$ (for $j=0, 1, 2, \ldots, N-1$) should make each of the frequency increments $\Delta F<i>$ (for $i=1, 2, \ldots, 2^N-1$) to be positive, and let the frequency increments $\Delta F<i>$ (for $i=1, 2, \ldots, 2^N-1$) to satisfy the expression $K=(H_{N-1}+H_{N-2}+\ldots+H_1+H_0+1)$.

TABLE 1

| | | | | | | | | | | 3031 |
|---|---|---|---|---|---|---|---|---|---|---|
| | 3041 | | | | 3032 | | | Frequency | | |
| $Q^{N-1}$ | ... $Q^2$ | $Q^1$ | $Q^0$ | $IS_{N-1}$ | ... $IS_2$ | $IS_1$ | $IS_0$ | increased | K<i> | $F_S$ |
| 0 | 0 0 0 | | | 0 | ... 0 | 0 | 0 | None | 0 | F<0> = FS1 |
| 0 | 0 0 1 | | | 0 | ... 0 | 0 | $J_0*I_0$ | $1^{st}$ time | $H_0$ | F<1> = ($H_0$ + 1) *FS1 |
| 0 | 0 1 0 | | | 0 | ... 0 | $J_1*I_0$ | 0 | $2^{nd}$ time | $H_1$ | F<2> = ($H_1$ + 1) *FS1 |
| 0 | 0 1 1 | | | 0 | ... 0 | $J_1*I_0$ | $J_0*I_0$ | $3^{rd}$ time | $H_0$ | F<3> = ($H_1$ + $H_0$ + 1) *FS1 |
| 0 | 1 0 0 | | | 0 | ... $H_2*I_0$ | 0 | 0 | $4^{th}$ time | $H_2$ | F<4> = ($H_2$ + 1) *FS1 |
| 0 | 1 0 1 | | | 0 | ... $H_2*I_0$ | 0 | $H_0*I_0$ | $5^{th}$ time | $H_0$ | F<5> = ($H_2$ + $H_0$ + 1) *FS1 |
| . | . | | | | ... | | | . | . | . |
| 1 | ... 1 1 1 | | | $H_{N-1}*I_0$ | ... $H_2*I_0$ | $H_1*I_0$ | $H_0*I_0$ | $(2^N - 1)^{th}$ time | $H_0$ | $F<2^N - 1>$ = ($H_{N-1}$ + $H_{N-2}$ + ... $H_1$ + $H_0$ + 1) *FS1 |

In accordance with an exemplary embodiment of the present invention, for the examples of FIG. 4 and FIG. 5, the $j^{th}$ current $I<j>=H_j*I_0$ (for each j=0, 1, 2, ..., N−1) provided by the $j^{th}$ controllable current source $IS_j$ may be set to be $2^j$ multiply the first constant current $I_0$. That is to say, the $j^{th}$ predetermined current multiple factor $H_j$ can be set to be $2^j$, i.e. $H_j=2^j$. In this circumstance, for each i=1, 2, ..., $(2^N-1)$, the $i^{th}$ time predetermined frequency increment ΔF<i>=FS1, the corresponding $i^{th}$ time second predetermined multiple factor K<i>=1, which indicates that the frequency increment for each time of step type frequency increase is equal, and is equally to be the first predetermined frequency FS1.

To provide better understanding, a specific example of N=3 and M=8 will be addressed in the following. In this example, the clock module 202 is configured to regulate the clock frequency $F_S$ to be increased from the first predetermined frequency FS1 to the second predetermined frequency FS2 through 7 times, i.e. $(2^3-1)$ times, of step type frequency increase during the startup procedure of the switching power converter 100. For each i=1, 2, 3, 4, 5, 6, 7, at the $i^{th}$ time step type frequency increase, the $i^{th}$ time frequency increment ΔF<i> is set to be equally equals to the first predetermined frequency FS1, and the $i^{th}$ time predetermined duration t<i−1> of the $i^{th}$ time pre-increase frequency F<i−1> is set to be 8 times of the $i^{th}$ time pre-increase clock period $T_S$<i−1> corresponding to the $i^{th}$ time pre-increase frequency F<i−1>. Therefore, in this specific example, the frequency regulation signal FCTL provided by the clock frequency regulator 304 has 3 (N=3) bit signals $Q^0$, $Q^1$, and $Q^2$, each of which has logic "0" state and logic "1" state. Thus, the combination of the 3 bit signals $Q^0$, $Q^1$, and $Q^2$ (i.e. the frequency regulation signal FCTL) has $2^3$ logic states including an initial state and 7 frequency regulation states. Correspondingly, the controllable current source module 3032 in the clock generator 303 comprises 3 controllable current sources respectively referred to as the $0^{th}$, the $1^{st}$ and the $2^{nd}$ controllable current sources $IS_0$, $IS_1$, and $IS_2$, and respectively having the $0^{th}$, the $1^{st}$ and the $2^{nd}$ current control terminals $G_0$, $G_1$, and $G_2$. The $0^{th}$, the $1^{st}$ and the $2^{nd}$ current control terminals $G_0$, $G_1$, and $G_2$ are respectively configured to receive the $0^{th}$, the $1^{st}$ and the $2^{nd}$ bit signals $Q^0$, $Q^1$, and $Q^2$ so as to control the $0^{th}$, the $1^{st}$ and the $2^{nd}$ controllable current sources $IS_0$, $IS_1$, and $IS_2$ to respectively provide the $0^{th}$, the $1^{st}$ and the $2^{nd}$ currents I<0>=$H_0*I_0$, I<1>=$H_1*I_1$, and I<2>=$H_2*I_0$, wherein the $0^{th}$, the $1^{st}$ and the $2^{nd}$ predetermined current multiple factors are respectively $H_0=2^0$, $H_1=2^1$, and $H_2=2^2$. More specifically, providing the 3-bit binary counter 3041 in the clock frequency regulator 304 is an up counter, the initial state of the combination of the 3 bit signals $Q^0$, $Q^1$, and $Q^2$ is set at logic "0" initial state, i.e. {0, 0, 0}. As an practical application example, supposing the main operating frequency of the switching power converter 100 after the startup procedure is 1/16MHZ, i.e. the second predetermined frequency FS2=1/16MHZ, it is desired to decrease the clock frequency $F_S$ to 1/128MHZ at the startup of the switching power converter 100, i.e. the first predetermined frequency FS1=1/128MHZ.

Since M=8, the up counter 3041 performs a counting in response to every 8 pulses of the clock signal CLK. Therefore, when 8 clock pulses elapses, i.e. the clock frequency regulator 304 detects that the $1^{st}$ time pre-increase frequency F<0>=FS1=1/128MHZ has lasted for 8 times of the $1^{st}$ time pre-increase clock period $T_S$<0>=128 μs (i.e. t<0>=8*$T_S$<0>), the 3-bit binary up counter conducts a $1^{st}$ time up counting. In consequence, the logic state of the combination of the 3 bit signals $Q^0$, $Q^1$, and $Q^2$ is changed from {0, 0, 0} to {0, 0, 1}, i.e. the frequency regulation control signal FCTL is changed from the logic "0" initial state {0, 0, 0} to the $1^{st}$ frequency regulation state {0, 0, 1}. In response to this, the $0^{th}$ controllable current source $IS_0$ in the controllable current source module 3032 provides the $0^{th}$ current $2^0*I_0$ to the clock generation module 3031 to regulate the clock frequency $F_S$ to perform the $1^{st}$ time step type frequency increase. The $1^{st}$ time frequency increment for the $1^{st}$ time step type frequency increase is ΔF<1>=$2^0$*FS1=1/128MHZ, and the $1^{st}$ time post-increase frequency F<1>=1/64MHZ. In the following, when another 8 clock pulses elapses, i.e. the clock frequency regulator 304 detects that the $2^{nd}$ time pre-increase frequency F<1>=1/64MHZ has lasted for 8 times of the $2^{nd}$ time pre-increase clock period $T_S$<1>=64 μs (i.e. t<1>=8*$T_S$<1>), the 3-bit binary up counter conducts a $2^{nd}$ time up counting, resulting in the logic state of the combination of the 3 bit signals $Q^0$, $Q^1$, and $Q^2$ changing from {0, 0, 1} to {0, 1, 0}. Thus, the $1^{st}$ controllable current source $IS_1$ in the controllable current source module 3032 provides the $1^{st}$ current $2^1*I_0$ to the clock generation module 3031 to regulate the clock frequency $F_S$ to perform the $2^{nd}$ time step type frequency increase. The $2^{nd}$ time frequency increment for the $2^{nd}$ time step type frequency increase is)ΔF<2>=($2^1$-$2^0$ *FS1=1/128MHZ, and the $2^{nd}$ time post-increase frequency F<2>=3/128MHZ. By that analogy, when the $3^{rd}$ time pre-increase frequency F<2> has lasted for 8 times of the $3^{rd}$ time pre-increase clock period $T_S$<2>=128/3 μs (i.e. t<2>=8*$T_S$<2>), the 3-bit binary up counter 3041 conducts a $3^{rd}$ time up counting, resulting in the logic state of the combination of the 3 bit signals $Q^0$, $Q^1$, and $Q^2$ changing from {0, 1, 0} to {0, 1, 1}. In consequence, the clock frequency $F_S$ performs the $3^{rd}$ time step type frequency increase, the $3^{rd}$ time frequency increment ΔF<3>=($2^1$+$2^0$−$2^1$)*FS1=1/128MHZ, and the $3^{rd}$ time post-increase frequency F<3>=1/32MHZ. When the $4^{th}$ time pre-increase frequency F<3> has lasted for 8 times of the $4^{th}$ time pre-increase clock period $T_S$<3>=32 μs (i.e. t<3>=8*$T_S$<3>), the 3-bit binary up counter 3041 conducts a $4^{th}$ time up counting, resulting in the logic state of the combination of the 3 bit signals $Q^0$, $Q^1$, and $Q^2$ changing from {0, 1, 1} to {1, 0, 0}. In consequence, the clock frequency $F_S$ performs the $4^{th}$ time step type frequency increase, the $4^{th}$ time frequency increment ΔF<4>=($2^2$−$2^1$−$2^0$)*FS1=1/128MHZ, and the $4^{th}$ time post-increase frequency F<4>=5/128MHZ. When the $5^{th}$ time pre-increase frequency F<4> has lasted for 8 times of the $5^{th}$ time pre-increase clock period $T_S$<4>=128/5 μs (i.e. t<4>=8*$T_S$<4>), the 3-bit binary up counter 3041 conducts a $5^{th}$ time up counting, resulting in the logic state of the combination of the 3 bit signals $Q^0$, $Q^1$, and $Q^2$ changing from {1, 0, 0} to {1, 0, 1}. In consequence, the clock frequency $F_S$ performs the $5^{th}$ time step type frequency increase, the $5^{th}$ time frequency increment ΔF<5>=($2^2$+$2^0$−$2^2$)*FS1=1/128MHZ, and the $5^{th}$ time post-increase frequency F<5>=3/64MHZ. When the $6^{th}$ time pre-increase frequency F<5> has lasted for 8 times of the $6^{th}$ time pre-increase clock period $T_S$<5>=64/3 μs (i.e. t<5>=8*$T_S$<5>), the 3-bit binary up counter 3041 conducts a $6^{th}$ time up counting, resulting in the logic state of the combination of the 3 bit signals $Q^0$, $Q^1$, and $Q^2$ changing from {1, 0, 1} to {1, 1, 0}. In consequence, the clock frequency $F_S$ performs the $6^{th}$ time step type frequency increase, the $6^{th}$ time frequency increment ΔF<6>=($2^2$+$2^1$−$2^2$−$2^0$)*FS1=1/128MHZ, and the $6^{th}$ time post-increase frequency F<6>=7/128MHZ. When the $7^{th}$ time pre-increase frequency F<6> has lasted for 8 times of the $7^{th}$ time pre-increase clock period $T_S$<6>=128/7 μs (i.e. t<6>=8*$T_S$<6>), the 3-bit binary up counter 3041 conducts a $7^{th}$ time up counting, resulting in the logic state of the combination of the 3 bit signals $Q^0$, $Q^1$, and $Q^2$ changing from {1, 1, 0} to {1, 1, 1}. In consequence, the clock frequency $F_S$ performs the $7^{th}$ time step type frequency increase, the $7^{th}$ time frequency increment ΔF<7>=($2^2$+$2^1$+$2^0$−$2^2$−$2^1$)*FS1=1/128 MHZ, and the $7^{th}$ time post-increase frequency F<7>=1/16MHZ. After that, the 3-bit binary up counter 3041 stops counting, and thus the clock frequency $F_S$ stops changing, which means that the startup procedure of the switching power converter 100 is completed. In this specific example, the total time T taken for performing the 7 times of step type frequency increase is T=t<0>+t<1>+t<2>+t<3>+t<4>+t<5>+t<6>. The total time T should be smaller than or at most equal to the predetermined startup duration of the switching power converter 100. For clarity, please refer to the Table 2 below illustrating the changes performed by the 3-bit binary up counter 3041, the controllable current source module 3032 and the clock generation module 3031 in the specific example where N=3 and M=8.

TABLE 2

| | 3041 | | | 3032 | | | | | 3031 |
|---|---|---|---|---|---|---|---|---|---|
| t<i> = 8*$T_S$<i> | $Q^2$ | $Q^1$ | $Q^0$ | $IS_2$ | $IS_1$ | $IS_0$ | frequency increase | K<i> | $F_S$ |
| t<0> = 8*$T_S$<0> | 0 | 0 | 0 | 0 | 0 | 0 | none | 0 | F<0> = FS1 = 1/128 MHZ |
| t<1> = 8*$T_S$<1> | 0 | 0 | 1 | 0 | 0 | $2^{0}$*$I_0$ | $1^{st}$ time | 1 | F<1> = ($2^0$ + 1) *FS1 |
| t<2> = 8*$T_S$<2> | 0 | 1 | 0 | 0 | $2^{1}$*$I_0$ | 0 | $2^{nd}$ time | 1 | F<2> = ($2^1$ + 1) *FS1 |
| t<3> = 8*$T_S$<3> | 0 | 1 | 1 | 0 | $2^{1}$*$I_0$ | $2^{0}$*$I_0$ | $3^{rd}$ time | 1 | F<3> = ($2^1$ + $2^0$ + 1) *FS1 |
| t<4> = 8*$T_S$<4> | 1 | 0 | 0 | $2^{2}$*$I_0$ | 0 | 0 | $4^{th}$ time | 1 | F<4> = ($2^2$ + 1) *FS1 |
| t<5> = 8*$T_S$<5> | 1 | 0 | 1 | $2^{2}$*$I_0$ | 0 | $2^{0}$*$I_0$ | $5^{th}$ time | 1 | F<5> = ($2^2$ + $2^0$ + 1) *FS1 |
| t<6> = 8*$T_S$<6> | 1 | 1 | 0 | $2^{2}$*$I_0$ | $2^{1}$*$I_0$ | 0 | $6^{th}$ time | 1 | F<6> = ($2^2$ + $2^1$ + 1)*FS1 |
| Stop counting | 1 | 1 | 1 | $2^{2}$*$I_0$ | $2^{1}$*$I_0$ | $2^{0}$*$I_0$ | $7^{th}$ time | 1 | F<7> = ($2^2$ + $2^1$ + $2^0$ + 1)*FS1 = 1/16 MHZ |

Although various embodiments of the clock module 202 and the control circuit 203 of the switching power converter 100 have been described above with reference to the FIGS. 1-5. This is not intended to be limiting.

Subsequently, referring back to FIG. 2, the control circuit 103 in accordance with an exemplary embodiment may further comprise a pulse width modulation (PWM) module 201, a current limit module 208, a logic operation module 203 and a logic control module 204. The PWM module 201 is configured to receive the feedback signal Vfb, the reference signal Vref and the first current sense signal Vcs1, and is configured to operate the reference signal Vref with the feedback signal Vfb to provide an amplified difference signal Vcomp indicative of a difference between the reference signal Vref and the feedback signal Vfb, and is further configured to compare the first current sense signal Vcs1 with the amplified difference signal Vcomp to provide a first comparison signal C1. In the example of FIG. 2, the PWM module 201 is illustrated to comprise an operational amplifier 301 and a PWM comparator 302. The operational amplifier 301 may have a first amplifier input terminal (e.g. the "+" input terminal of 301 in FIG. 2) configured to receive the feedback signal Vfb, a second amplifier input terminal (e.g. the "−" input terminal of 301 in FIG. 2) configured to receive the reference signal Vref, and an amplifier output terminal configured to provide the amplified difference signal Vcomp. For enhancing the control stability, a compensation circuit may be coupled between the first amplifier input terminal and the amplifier output terminal, e.g. in FIG. 2, the compensation circuit is illustrated to comprise a resistor and a capacitor connected in series. The PWM comparator 302 may have a first comparator input terminal (e.g. the "−" input terminal of 302 in FIG. 2) configured to receive the first current sense signal Vcs1, a second comparator input terminal (e.g. the "+" input terminal of 302 in FIG. 2) configured to receive the amplified difference signal Vcomp, and a comparator output terminal configured to provide the first comparison signal C1.

The current limit module 208 may be configured to receive the first current sense signal Vcs1 and the first current limit threshold Vth1, and to compare the first current sense signal Vcs1 with the first current limit threshold Vth1 to provide a second comparison signal C2. In the example of FIG. 2, the current limit module 208 may comprise a current limit comparator as illustrated. In an exemplary embodiment, when the first current sense signal Vcs1 is higher than the first current limit threshold Vth1, the current limit module 208 is configured to regulate the second comparison signal C2 to generate a narrow pulse to trigger the pulse width modulation signal PWM to turn the main switch 101 off. When the first current sense signal Vcs1 is lower than the first current limit threshold Vth1, the current limit module 208 is configured to maintain the second comparison signal C2 at logic low and thus the second comparison signal C2 does not trigger the pulse width modulation signal PWM.

The logic operation module 203 is configured to receive the first comparison signal C1 and the second comparison signal C2, and to conduct logic operation to the first comparison signal C1 and the second comparison signal C2 to provide the off trigger signal OFFCTL, wherein the first comparison signal C1 is provided as the off trigger signal OFFCTL when the first current sense signal Vcs1 is lower than the first current limit threshold Vth1, and wherein the second comparison signal C2 is provided as the off trigger signal OFFCTL when the first current sense signal Vcs1 is larger than the first current limit threshold Vth1. In FIG. 2, the logic operation module 203 is illustrated to comprise an "OR" logic module, but this is not intended to be limiting. In other embodiments, the logic operation module 203 may comprise other logic modules.

The logic control module 204 is configured to receive the off trigger signal OFFCTL and the clock signal CLK, and to generate the pulse width modulated signal PWM based on the off trigger signal OFFCTL and the clock signal CLK, wherein the pulse width modulated signal PWM is configured to drive the main switch 101 to switch on in response to the clock signal CLK, and to drive the main switch 101 to switch off in response to the off trigger signal OFFCTL. In an embodiment, the logic control module 204 is configured to set the pulse width modulation signal PWM at a first logic state (e.g. logic high) in response to each pulse of the clock signal CLK, and to set the pulse width modulation signal PWM at a second logic state (e.g. logic low) in response to each pulse of the off trigger signal OFFCTL. In this case, the pulse width modulation signal PWM is configured to turn the main switch 101 on at the first logic state and to turn the main switch 101 off at the second logic state.

In accordance with an embodiment of the present invention, the control circuit 103 may further comprise a current sense module 206. The current sense module 206 is electrically coupled to the main switch 101 to sense the switching current $I_H$ flowing through the main switch 101 so as to provide a second current sense signal Vcs2 proportional to the switching current $I_H$. In the example of FIG. 2, the current sense module 206 is illustrated to comprise a current sense resistor RS coupled between the main switch 101 and the reference ground GND. In other embodiment, the current sense module 206 may comprise other current sense circuit and may be appropriately chosen for different switching power converters with different topologies.

In accordance with an exemplary embodiment of the present invention, still referring to FIG. 2, the control circuit 103 may further comprise a leading edge blanking (LEB) module 207 and a ramp compensation module 205. The LEB module 207 may have a LEB input terminal, a LEB output terminal and a predetermined blanking time $T_{LEB}$, wherein the LEB input terminal is configured to receive the second current sense signal Vcs2, and the LEB module 207 is configured to blank the second current sense signal Vcs2 in the predetermined LEB time $T_{LEB}$ and to provide the leading edge blanked second current sense signal (labeled with Vcs2') at the LEB output terminal. Since there exists a parasitic capacitor between the switch module and the reference ground GND (e.g. between the switching output terminal SW and the reference ground GND) of the switching power converter 100, spikes may occur in the switching current $I_H$, and thus in the second current sense signal Vcs2, at each leading edge of the switching cycles. The LEB module 207 can blank the second current sense signal Vcs2 at each leading edge in the predetermined LEB time $T_{LEB}$ so as to shield the affection of the spikes to the control circuit 103, for example to prevent the spikes at each leading edge of the second current sense signal Vcs2 from mis-triggering the current limit module 208 and resulting in the main switch 101 being turned off prematurely. The ramp compensation module 205 may have a first compensation input terminal, a second compensation input terminal and a compensation output terminal, wherein the first compensation input terminal is electrically coupled to the LEB output terminal to receive the leading edge blanked second current sense signal Vcs2', the second compensation input terminal is configured to receive a ramp compensation signal Vcomp having a predetermined slope, and wherein the ramp compensation module 205 is configured to add the ramp compensation signal with the leading edge blanked second current sense signal Vcs2' to generate the first current sense signal Vcs1. The ramp compensation signal Vramp has a frequency that is the same as the clock frequency $F_S$.

In accordance with the various embodiments described with reference to FIGS. 1-5, the clock module 202 can set the clock frequency $F_S$ at the first predetermined frequency FS1 at the moment when the switching power converter 100 is powered on. The first predetermined frequency FS1 is lower than the second predetermined frequency FS2 (i.e. the main operating frequency of the switching power converter 100 after the start up procedure), thus the switching period of the switching power converter 100 is increased during the startup procedure. Therefore, for each switching period of the startup procedure, the duty cycle D can be smaller than the allowable minimum duty cycle of the normal operating state after the startup procedure. Given the required predetermined LEB time $T_{LEB}$ the same, compared to a switching power converter that operates with the main operating frequency FS2 during the startup procedure, the switching power converter 100 in accordance with various embodiments of the present invention that increases the switching frequency gradually from the first predetermined frequency FS1 to the main operating frequency FS2 allows the inductor current $I_L$ of the inductive power storage element 104 to satisfy voltage-second balance. Therefore, the inductor current $I_L$ will not continuously increasing as should be without using the clock module 202 of the present invention, which greatly reduces the possibility of damage to the switching power converter due to continuous increase in the inductor current $I_L$. As has been discussed in the various embodiments above, the clock module 202 controls the clock frequency $F_S$ to increase from the first predetermined frequency FS1 to the second predetermined frequency FS2 through a predetermined times of step type frequency increase during the startup procedure, by appropriately setting the predetermined times (e.g. $2^N-1$), the frequency increment $\Delta F<i>$ and the pre-increase duration $t<i-1>$ for each time of step type frequency increase, the inductor current $I_L$ may be controlled to satisfy the voltage-second balance during the whole startup procedure without causing abrupt increase in the inductor current $I_L$, ensuring the switching power converter 100 to be started up smoothly and safely. Thus, the switching power converter 100 having the clock module 202 can not only be started up safely but also eliminate or at least reduce the influence of the parasitic capacitor between the switch module and the reference ground GND to the control circuit 103, resulting in an enhanced stability and robustness.

The advantages of the various embodiments of the control circuit 103, the clock module 202 and the switching power converter 100 or 200 comprising the control circuit 103 or the clock module 202 of the present invention are not confined to those described above. These and other advantages of the various embodiments of the present invention will become more apparent upon reading the whole detailed descriptions and studying the various figures of the drawings.

Figure 6:
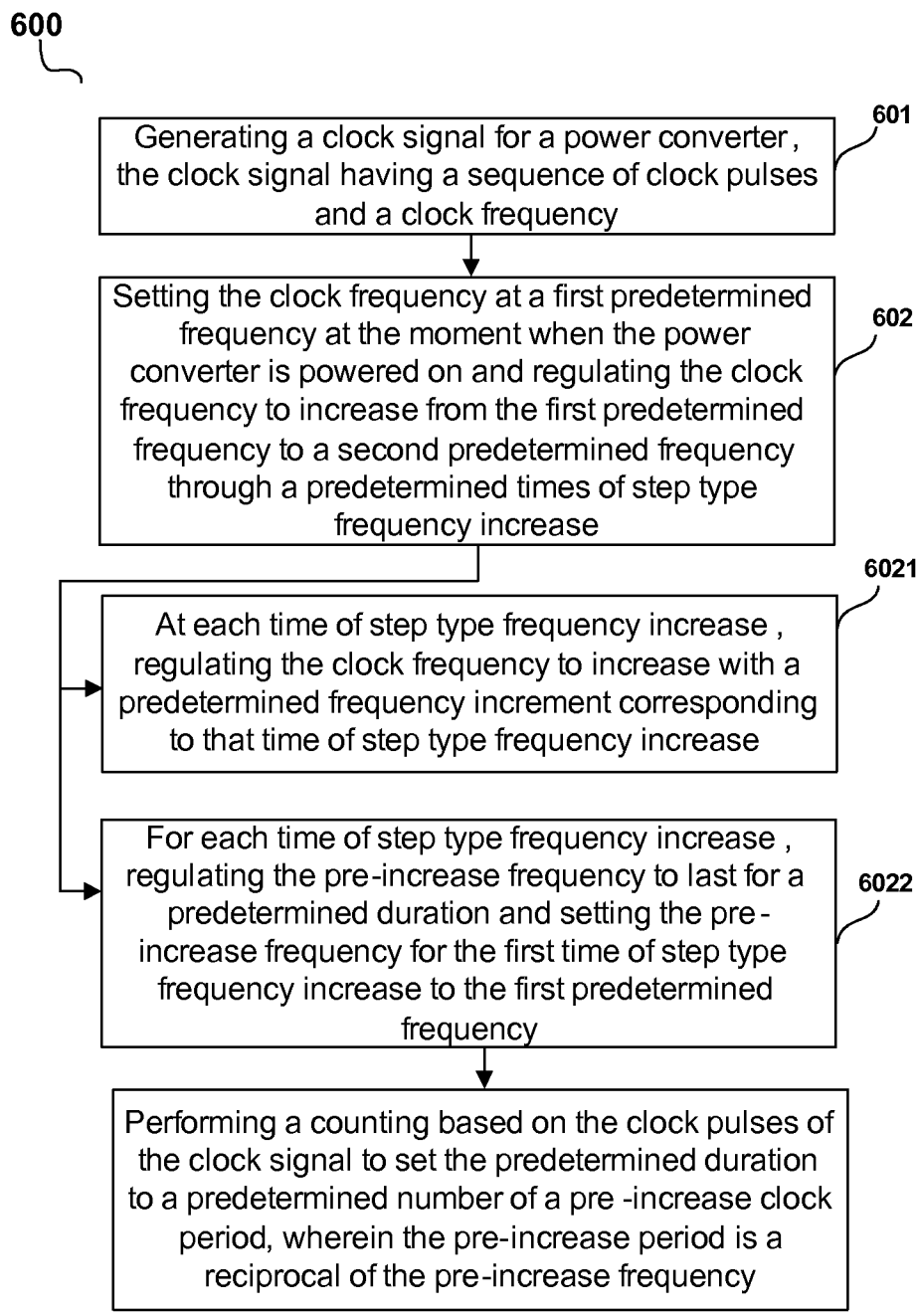
FIG. 6 illustrates a flow diagram of a method 600 for controlling a clock signal of a switching power converter in accordance with an exemplary embodiment of the present invention.

FIG. 6 illustrates a flow diagram of a method 600 for controlling a clock signal of a switching power converter in accordance with an exemplary embodiment of the present invention. The switching power converter (such as the power converter 100) may at least comprise a main switch (e.g. the main switch 101) and is configured to converter an input voltage (Vin) to an output voltage (Vo) based on driving the main switch to switch on and off. The switching power converter has a startup procedure begins at the moment when the switching power converter 100 is powered on and ends when the output voltage Vo arrives at its desired steady state value. The method 600 may comprise: step 601, generating a clock signal (CLK) having a sequence of clock pulses and a clock frequency ($F_S$); step 602, setting the clock frequency at a first predetermined frequency (FS1) at the moment when the switching power converter 100 is powered on and regulating the clock frequency to increase from the first predetermined frequency to a second predetermined frequency (FS2) through a predetermined times of step type frequency increase.

In accordance with an exemplary embodiment, the method 600 may further comprise: at the step 602, performing a step 6021, i.e. at each time of step type frequency increase, regulating the clock frequency to increase with a predetermined frequency increment corresponding to that time of step type frequency increase.

In accordance with an exemplary embodiment, the clock frequency may have a pre-increase frequency before each time of step type frequency increase and a post-increase frequency after each time of step type frequency increase, the method 602 may further comprise, at the step 602, performing a step 6022, i.e. for each time of step type frequency increase, regulating the pre-increase frequency to last for a predetermined duration and setting the pre-increase frequency for the first time of step type frequency increase to the first predetermined frequency, and setting the post-increase frequency for the last time of step type frequency increase to the second predetermined frequency.

In accordance with an exemplary embodiment, at the step 6022, regulating the pre-increase frequency to last for a predetermined duration comprises performing a counting based on the clock pulses of the clock signal to set the predetermined duration to a predetermined number of a pre-increase clock period, wherein the pre-increase period is a reciprocal of the pre-increase frequency.

Methods and steps of controlling a clock signal of the power converter described above in the various embodiments of the present invention are not intended to be limiting. Well known controlling steps, operating processes, and parameters etc. are not described in detail to avoid obscuring aspects of the invention. Those skilled in the art should understand that the steps described in the embodiments with reference to FIG. 6 may be implemented in different orders and are not limited to the embodiments described.

Although a control circuit, a clock module and a switching power converter and associated control methods are illustrated and explained based on a fly-back power converter according to various embodiments of the present invention, this is not intended to be limiting. Persons of ordinary skill in the art will understand that the circuits, methods and principles taught herein may apply to any other suitable types of power converters, such as buck type power converter, boost type power converter, or buck-boost type power converter etc.

From the foregoing, it will be appreciated that specific embodiments of the present invention have been described herein for purposes of illustration, but that various modifications may be made without deviating from the spirit and scope of various embodiments of the present invention. Many of the elements of one embodiment may be combined with other embodiments in addition to or in lieu of the elements of the other embodiments. Accordingly, the present invention is not limited except as by the appended claims.

I claim:

1. A clock module for providing a clock signal to a power converter, wherein the power converter has a startup procedure beginning at the moment when the power converter is powered on and ending when an output voltage of the power converter arrives at a desired steady state value, the clock module comprising:
    a clock generator, having a clock control terminal and a clock output terminal, wherein the clock control terminal is configured to receive a frequency regulation signal, and wherein the clock generator is configured to provide the clock signal at the clock output terminal, and wherein the clock signal has a sequence of clock pulses and a clock frequency; and
    a clock frequency modulator, having a modulator input terminal and a modulator output terminal, wherein the modulator input terminal is configured to receive the clock signal, and wherein the clock frequency modulator is configured to perform a timing based on the pulses of the clock signal and to provide the frequency regulation signal at the modulator output terminal based on the timing, and wherein the frequency regulation signal is configured to set the clock frequency at a first predetermined frequency at the moment when the power converter is powered on, and to regulate the clock frequency to increase from the first predetermined frequency to a second predetermined frequency through a predetermined times of step type frequency increase during the startup procedure.

2. The clock module of claim 1, wherein
    the clock frequency modulator is further configured to regulate the clock frequency to increase with a predetermined frequency increment for each time of step type frequency increase.

3. The clock module of claim 1, wherein for each time of step type frequency increase, the clock frequency has a pre-increase frequency before that time of step type frequency increase and a post-increase frequency after that time of step type frequency increase, and wherein the clock frequency modulator is further configured to set the pre-increase frequency for the first time of step type frequency increase to the first predetermined frequency; and wherein the clock frequency modulator is further configured to set the post-increase frequency for the last time of step type frequency increase to the second predetermined frequency; and wherein the clock frequency modulator is further configured to regulate the pre-increase frequency for each time of step type frequency increase to last for a predetermined duration.

4. The clock module of claim 1, wherein the frequency regulation signal has an initial state and a predetermined number of frequency regulation state, and wherein the predetermined number of frequency regulation states are respectively corresponding to the predetermined times of step type frequency increase, and wherein the clock frequency modulator is configured to set the clock frequency to the first predetermined frequency at the initial state of the frequency regulation signal, and wherein the clock frequency modulator is further configured to regulate the clock frequency to conduct a step type frequency increase each time the frequency regulation signal changes from one frequency regulation state to another frequency regulation state.

5. The clock module of claim 4, wherein the clock frequency modulator is configured to change the frequency regulation signal from one frequency regulation state to another frequency regulation state every time the timing reaches M pulses of the clock signal, and wherein M is a positive integer.

6. The clock module of claim 4, wherein:
the predetermined times is set to $2^N-1$, wherein N is a positive integer; and wherein
the predetermined number is set to $2^N-1$; and wherein
the clock frequency modulator comprises:
an N-bit binary up counter, having a clock input terminal and N-bit output terminals, wherein the clock input terminal is configured to receive the clock signal, and wherein the N-bit output terminals are respectively the $0^{th}$ to the $(N-1)^{th}$ bit output terminals from the lowest precedence to the highest precedence, and are respectively configured to output a $0^{th}$ to a $(N-1)^{th}$ binary bit signals of the N-bit binary up counter, and wherein each of the $0^{th}$ to the $(N-1)^{th}$ binary bit signals has a logic "0" state and a logic "1" state making a combination of the $0^{th}$ to the $(N-1)^{th}$ binary bit signals to have $2^N$ logic states, wherein the $2^N$ logic states comprise a logic "0" initial state used as the initial state of the frequency regulation signal, and $(2^N-1)$ other logic states used as the $(2^N-1)$ frequency regulation states of the frequency regulation signal, and wherein the N-bit binary counter is configured to perform an up counting to change the combination of the $0^{th}$ to the $(N-1)^{th}$ binary bit signals from one logic state to another among the $2^N$ logic states for once in response to each pulse of the clock signal, starting from the logic "0" initial state; and wherein the clock generator comprises:
a clock generation module at least comprising a constant current source and a capacitor, wherein the clock generation module is configured to generate the clock signal at least partially based on charging and discharging of the capacitor by the constant current source, and wherein the constant current source is configured to provide a first constant current, and wherein the first constant current is configured to determine the first predetermined frequency; and a controllable current source module having N controllable current sources referred to as the $0^{th}$ to the $(N-1)^{th}$ controllable current sources, wherein the $0^{th}$ to the $(N-1)^{th}$ controllable current sources are respectively electrically coupled to the capacitor and in parallel with the first constant current source; and wherein, for each j=0, 1, 2, ..., N-1, the $j^{th}$ controllable current source may have a $j^{th}$ current control terminal and a $j^{th}$ current output terminal, wherein the $j^{th}$ current control terminal is configured to receive the $j^{th}$ binary bit signal generated at the $j^{th}$ output terminal of the N-bit binary up counter, and wherein $j^{th}$ controllable current source is configured to to provide a $j^{th}$ current to the $j^{th}$ current output terminal in response the logic "1" state of the $j^{th}$ binary bit signal, and wherein the $j^{th}$ current is set to be a multiple of the first constant current with a $j^{th}$ predetermined current multiple factor.

7. The clock module of claim 4, wherein:
the predetermined times is set to $2^N-1$, wherein N is a positive integer; and wherein
the predetermined number is set to $2^N-1$; and wherein
the clock frequency modulator comprises:
an N-bit binary down counter, having a clock input terminal and N-bit output terminals, wherein the clock input terminal is configured to receive the clock signal, and wherein the N-bit output terminals are respectively the $0^{th}$ to the $(N-1)^{th}$ bit output terminals from the lowest precedence to the highest precedence, and are respectively configured to output a $0^{th}$ to a $(N-1)^{th}$ binary bit signals of the N-bit binary down counter, and wherein each of the $0^{th}$ to the $(N-1)^{th}$ binary bit signals has a logic "0" state and a logic "1" state making a combination of the $0^{th}$ to the $(N-1)^{th}$ binary bit signals to have $2^N$ logic states, wherein the $2^N$ logic states comprise a logic "1" initial state used as the initial state of the frequency regulation signal, and $(2^N-1)$ other logic states used as the $(2^N-1)$ frequency regulation states of the frequency regulation signal, and wherein the N-bit binary counter is configured to perform a down counting to change the combination of the $0^{th}$ to the $(N-1)^{th}$ binary bit signals from one logic state to another among the $2^N$ logic states for once in response to each pulse of the clock signal, starting from the logic "1" initial state; and wherein the clock generator comprises:
a clock generation module at least comprising a constant current source and a capacitor, wherein the clock generation module is configured to generate the clock signal at least partially based on charging and discharging of the capacitor by the constant current source, and wherein the constant current source is configured to provide a first constant current, and wherein the first constant current is configured to determine the first predetermined frequency; and a controllable current source module having N controllable current sources referred to as the $0^{th}$ to the $(N-1)^{th}$ controllable current sources, wherein the $0^{th}$ to the $(N-1)^{th}$ controllable current sources are respectively electrically coupled to the capacitor and in parallel with the first constant current source; and wherein, for each j=0, 1, 2, ..., N−1, the $j^{th}$ controllable current source may have a $j^{th}$ current control terminal and a $j^{th}$ current output terminal, wherein the $j^{th}$ current control terminal is configured to receive the $j^{th}$ binary bit signal generated at the $j^{th}$ output terminal of the N-bit binary up counter, and wherein $j^{th}$ controllable current source is configured to to provide a $j^{th}$ current to the $j^{th}$ current output terminal in response the logic "0" state of the $j^{th}$ binary bit signal, and wherein the $j^{th}$ current is set to be a multiple of the first constant current with a $j^{th}$ predetermined current multiple factor.

8. The clock module of claim 4, wherein:

the predetermined times is set to $2^N-1$, wherein N is a positive integer; and wherein the predetermined number is set to $2^N-1$; and wherein the clock frequency modulator comprises:

a frequency divider having a frequency dividing input terminal and a frequency dividing output terminal, wherein the frequency dividing input terminal is configured to receive the clock signal, and wherein the frequency divider is configured to divide the frequency of the clock signal with 1/M so as to generate a frequency divided signal, wherein M is a positive integer; and an N-bit binary up counter, having a clock input terminal and N-bit output terminals, wherein the clock input terminal is configured to receive the frequency divided signal, and wherein the N-bit output terminals are respectively the $0^{th}$ to the $(N-1)^{th}$ bit output terminals from the lowest precedence to the highest precedence, and are respectively configured to output a $0^{th}$ to a $(N-1)^{th}$ binary bit signals of the N-bit binary up counter, and wherein each of the $0^{th}$ to the $(N-1)^{th}$ binary bit signals has a logic "0" state and a logic "1" state making a combination of the $0^{th}$ to the $(N-1)^{th}$ binary bit signals to have $2^N$ logic states, wherein the $2^N$ logic states comprise a logic "0" initial state used as the initial state of the frequency regulation signal, and $(2^N-1)$ other logic states used as the $(2^N-1)$ frequency regulation states of the frequency regulation signal, and wherein the N-bit binary counter is configured to perform an up counting to change the combination of the $0^{th}$ to the $(N-1)^{th}$ binary bit signals from one logic state to another among the $2^N$ logic states for once in response to each pulse of the frequency divided signal, starting from the logic "0" initial state; and wherein the clock generator comprises:

a clock generation module at least comprising a constant current source and a capacitor, wherein the clock generation module is configured to generate the clock signal at least partially based on charging and discharging of the capacitor by the constant current source, and wherein the constant current source is configured to provide a first constant current, and wherein the first constant current is configured to determine the first predetermined frequency; and a controllable current source module having N controllable current sources referred to as the $0^{th}$ to the $(N-1)^{th}$ controllable current sources, wherein the $0^{th}$ to the $(N-1)^{th}$ controllable current sources are respectively electrically coupled to the capacitor and in parallel with the first constant current source; and wherein, for each j=0, 1, 2, ..., N−1, the $j^{th}$ controllable current source may have a $j^{th}$ current control terminal and a $j^{th}$ current output terminal, wherein the $j^{th}$ current control terminal is configured to receive the $j^{th}$ binary bit signal generated at the $j^{th}$ output terminal of the N-bit binary up counter, and wherein $j^{th}$ controllable current source is configured to to provide a $j^{th}$ current to the $j^{th}$ current output terminal in response the logic "1" state of the $j^{th}$ binary bit signal, and wherein the $j^{th}$ current is set to be a multiple of the first constant current with a $j^{th}$ predetermined current multiple factor.

9. The clock module of claim 4, wherein:

the predetermined times is set to $2^N-1$, wherein N is a positive integer; and wherein the predetermined number is set to $2^N-1$; and wherein the clock frequency modulator comprises:

a frequency divider having a frequency dividing input terminal and a frequency dividing output terminal, wherein the frequency dividing input terminal is configured to receive the clock signal, and wherein the frequency divider is configured to divide the frequency of the clock signal with 1/M so as to generate a frequency divided signal, wherein M is a positive integer; and an N-bit binary down counter, having a clock input terminal and N-bit output terminals, wherein the clock input terminal is configured to receive the frequency divided signal, and wherein the N-bit output terminals are respectively the $0^{th}$ to the $(N-1)^{th}$ bit output terminals from the lowest precedence to the highest precedence, and are respectively configured to output a $0^{th}$ to a $(N-1)^{th}$ binary bit signals of the N-bit binary down counter, and wherein each of the $0^{th}$ to the $(N-1)^{th}$ binary bit signals has a logic "0" state and a logic "1" state making a combination of the $0^{th}$ to the $(N-1)^{th}$ binary bit signals to have $2^N$ logic states, wherein the $2^N$ logic states comprise a logic "1" initial state used as the initial state of the frequency regulation signal, and $(2^N-1)$ other logic states used as the $(2^{N-1})$ frequency regulation states of the frequency regulation signal, and wherein the N-bit binary counter is configured to perform a down counting to change the combination of the $0^{th}$ to the $(N-1)^{th}$ binary bit signals from one logic state to another among the $2^N$ logic states for once in response to each pulse of the frequency divided signal, starting from the logic "1" initial state; and wherein the clock generator comprises:

a clock generation module at least comprising a constant current source and a capacitor, wherein the clock generation module is configured to generate the clock signal at least partially based on charging and discharging of the capacitor by the constant current source, and wherein the constant current source is configured to provide a first constant current, and wherein the first constant current is configured to determine the first predetermined frequency; and a controllable current source module having N controllable current sources referred to as the $0^{th}$ to the $(N-1)^{th}$ controllable current sources, wherein the $0^{th}$ to the $(N-1)^{th}$ controllable current sources are respectively electrically coupled to the capacitor and in parallel with the first constant current source; and wherein, for each $j=0, 1, 2, \ldots, N-1$, the $j^{th}$ controllable current source may have a $j^{th}$ current control terminal and a $j^{th}$ current output terminal, wherein the $j^{th}$ current control terminal is configured to receive the $j^{th}$ binary bit signal generated at the $j^{th}$ output terminal of the N-bit binary up counter, and wherein $j^{th}$ controllable current source is configured to to provide a $j^{th}$ current to the $j^{th}$ current output terminal in response the logic "0" state of the $j^{th}$ binary bit signal, and wherein the $j^{th}$ current is set to be a multiple of the first constant current with a $j^{th}$ predetermined current multiple factor.

10. A power converter comprising a clock module of claim 1, wherein the power converter further comprises:
an input port configured to receive an input voltage;
an output port configured to provide an output voltage;
a switch module at least comprising a main switch and configured to conduct on and off switching in response to a pulse width modulation signal so as to convert the input voltage into the output voltage; and
a control circuit having a first control input terminal, a second control input terminal, a third control input terminal, a fourth control input terminal and a first control output terminal, wherein the first control input terminal is configured to receive a feedback signal indicative of the output voltage, the second control input terminal is configured to receive a first current sense signal indicative of a switching current flowing through the main switch, the third control input terminal is configured to receive a reference signal indicative of a desired value of the output voltage, the fourth control input terminal is configured to receive a first current limit threshold indicative of a maximum allowable peak value of the switching current, and the first control output terminal is configured to provide the pulse modulated signal; and wherein
the control circuit is configured to generate an off trigger signal based on the feedback signal, the first current sense signal, the reference signal and the first current limit threshold; and wherein
the control circuit is further configured to generate the pulse width modulated signal based on the clock signal and the off trigger signal, wherein the clock signal is configured to trigger the pulsed width modulated signal to turn the main switch on, and wherein the off trigger signal is configured to trigger the pulse width modulated signal to turn the main switch off.

11. The power converter of claim 10, wherein the control circuit comprises:
a pulse width modulation module configured to receive the feedback signal, the reference signal and the first current sense signal, and further configured to operate the reference signal with the feedback signal to provide an amplified difference signal indicative of a difference between the reference signal and the feedback signal, and further configured to compare the first current sense signal with the amplified difference signal to provide a first comparison signal;
a current limit module configured to receive the first current sense signal and the first current limit threshold, and to compare the first current sense signal with the first current limit threshold to provide a second comparison signal;

a logic operation module configured to receive the first comparison signal and the second comparison signal, and to conduct logic operation to the first comparison signal and the second comparison signal to provide the off trigger signal, wherein the first comparison signal is provided as the off trigger signal when the first current sense signal is lower than the first current limit threshold, and wherein the second comparison signal is provided as the off trigger signal when the first current sense signal is larger than the first current limit threshold; and
a logic control module configured to receive the off trigger signal and the clock signal, and to generate the pulse width modulated signal based on the off trigger signal and the clock signal, wherein the pulse width modulated signal is configured to drive the main switch to switch on in response to the clock signal, and to drive the main switch to switch off in response to the off trigger signal.

12. The power converter of claim 10, further comprising:
an inductive power storage element configured to be electrically coupled to the input port to store energy when the main switch is switched on, and to be electrically coupled to the output port to discharge energy when the main switch is switched off; and
a capacitive output filtering device coupled to the output port to filter the output voltage.

13. A control circuit for a power converter comprising the clock module of claim 1, wherein
the control circuit has a first control input terminal, a second control input terminal, a third control input terminal, a fourth control input terminal and a first control output terminal, wherein the first control input terminal is configured to receive a feedback signal indicative of the output voltage, the second control input terminal is configured to receive a first current sense signal indicative of a switching current flowing through the main switch, the third control input terminal is configured to receive a reference signal indicative of a desired value of the output voltage, the fourth control input terminal is configured to receive a first current limit threshold indicative of a maximum allowable peak value of the switching current, and the first control output terminal is configured to provide the pulse modulated signal; and wherein
the control circuit is configured to generate an off trigger signal based on the feedback signal, the first current sense signal, the reference signal and the first current limit threshold; and wherein
the control circuit is further configured to generate the pulse width modulated signal based on the clock signal and the off trigger signal, wherein the clock signal is configured to trigger the pulsed width modulated signal to turn the main switch on, and wherein the off trigger signal is configured to trigger the pulse width modulated signal to turn the main switch off.

14. The control circuit of claim 13, further comprising:
a pulse width modulation module configured to receive the feedback signal, the reference signal and the first current sense signal, and further configured to operate the reference signal with the feedback signal to provide an amplified difference signal indicative of a difference between the reference signal and the feedback signal, and further configured to compare the first current sense signal with the amplified difference signal to provide a first comparison signal;

a current limit module configured to receive the first current sense signal and the first current limit threshold, and to compare the first current sense signal with the first current limit threshold to provide a second comparison signal;

a logic operation module configured to receive the first comparison signal and the second comparison signal, and to conduct logic operation to the first comparison signal and the second comparison signal to provide the off trigger signal, wherein the first comparison signal is provided as the off trigger signal when the first current sense signal is lower than the first current limit threshold, and wherein the second comparison signal is provided as the off trigger signal when the first current sense signal is larger than the first current limit threshold; and a logic control module configured to receive the off trigger signal and the clock signal, and to generate the pulse width modulated signal based on the off trigger signal and the clock signal, wherein the pulse width modulated signal is configured to drive the main switch to switch on in response to the clock signal, and to drive the main switch to switch off in response to the off trigger signal.

15. The control circuit of claim 13, further comprising:
a leading edge blanking (LEB) module having a LEB input terminal, a LEB output terminal and a predetermined blanking time, wherein the LEB input terminal is configured to receive a second current sense signal proportional to the switching current, and wherein the LEB module is configured to blank the second current sense signal in the predetermined LEB time to provide a leading edge blanked second current sense signal at the LEB output terminal; and a ramp compensation module having a first compensation input terminal, a second compensation input terminal and a compensation output terminal, wherein the first compensation input terminal is electrically coupled to the LEB output terminal to receive the leading edge blanked second current sense signal, the second compensation input terminal is configured to receive a ramp compensation signal having a predetermined slope, and wherein the ramp compensation module is configured to add the ramp compensation signal with the leading edge blanked second current sense signal to generate the first current sense signal.

16. The control circuit of claim 13, further comprising:
a current sense module electrically coupled to the main switch to sense the switching current so as to provide the second current sense signal proportional to the switching current.

17. A method for controlling a clock signal of a power converter, wherein the power converter has a startup procedure beginning at the moment when the power converter is powered on and ending when an output voltage of the power converter arrives at a desired steady state value, the method comprising:
generating a clock signal having a sequence of clock pulses and a clock frequency; and setting the clock frequency at a first predetermined frequency at the moment when the power converter is powered on and regulating the clock frequency to increase from the first predetermined frequency to a second predetermined frequency through a predetermined times of step type frequency increase.

18. The method of claim 17, further comprising:
at each time of step type frequency increase, regulating the clock frequency to increase with a predetermined frequency increment corresponding to that time of step type frequency increase.

19. The method of claim 17, wherein the clock frequency has a pre-increase frequency before each time of step type frequency increase and a post-increase frequency after each time of step type frequency increase, the method further comprising:
for each time of step type frequency increase, regulating the pre-increase frequency to last for a predetermined duration and setting the pre-increase frequency for the first time of step type frequency increase to the first predetermined frequency, and setting the post-increase frequency for the last time of step type frequency increase to the second predetermined frequency.

20. The method of claim 19, wherein
regulating the pre-increase frequency to last for a predetermined duration comprises performing a counting based on the clock pulses of the clock signal to set the predetermined duration to a predetermined number of a pre-increase clock period, wherein the pre-increase period is a reciprocal of the pre-increase frequency.

* * * * *